US007923358B2

(12) United States Patent
Kim et al.

(10) Patent No.: US 7,923,358 B2
(45) Date of Patent: Apr. 12, 2011

(54) METHODS FOR PREPARATION OF HIGH-PURITY POLYSILICON RODS USING A METALLIC CORE MEANS

(75) Inventors: Hee Young Kim, Daejeon (KR); Kyung Koo Yoon, Daejeon (KR); Yong Ki Park, Daejeon (KR); Won Choon Choi, Daejeon (KR); Sang Jin Moon, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 41 days.

(21) Appl. No.: 12/603,072

(22) Filed: Oct. 21, 2009

(65) Prior Publication Data
US 2010/0041215 A1 Feb. 18, 2010

Related U.S. Application Data

(63) Continuation of application No. 12/160,837, filed as application No. PCT/KR2007/002457 on May 21, 2007.

(30) Foreign Application Priority Data

May 22, 2006 (KR) .................. 10-2006-0045707

(51) Int. Cl.
*C23C 16/24* (2006.01)
(52) U.S. Cl. ........ 438/488; 438/490; 428/364; 423/348; 423/349; 118/620
(58) Field of Classification Search .................... None
See application file for complete search history.

(56) References Cited

U.S. PATENT DOCUMENTS

| | | | |
|---|---|---|---|
| 3,941,900 | A | 3/1976 | Stut et al. |
| 4,179,530 | A | 12/1979 | Koppl et al. |
| 4,215,154 | A | 7/1980 | Behensky et al. |
| 5,277,934 | A | 1/1994 | Gilbert et al. |
| 5,284,640 | A | 2/1994 | Jernegan et al. |
| 5,327,454 | A | 7/1994 | Ohtsuki et al. |
| 5,895,594 | A | 4/1999 | Fuchs |
| 5,904,981 | A | 5/1999 | Oda |

FOREIGN PATENT DOCUMENTS

JP 11-008398 A 1/1999

*Primary Examiner* — Charles D Garber
*Assistant Examiner* — Yasser A Abdelaziez
(74) *Attorney, Agent, or Firm* — Frommer Lawrence & Haug LLP; Ronald R. Santucci

(57) ABSTRACT

The present invention relates to a method for preparing a polysilicon rod using a metallic core means, comprising: installing a core means in an inner space of a deposition reactor used for preparing a silicon rod, wherein the core means is constituted by forming one or a plurality of separation layer(s) on the surface of a metallic core element and is connected to an electrode means; heating the core means by supplying electricity through the electrode means; and supplying a reaction gas into the inner space for silicon deposition, thereby forming a deposition output in an outward direction on the surface of the core means. According to the present invention, the deposition output and the core means can be separated easily from the silicon rod output obtained by the process of silicon deposition, and the contamination of the deposition output caused by impurities of the metallic core element can be minimized, thereby a high-purity silicon can be prepared in a more economic and convenient way.

20 Claims, 9 Drawing Sheets

[Fig. 1]
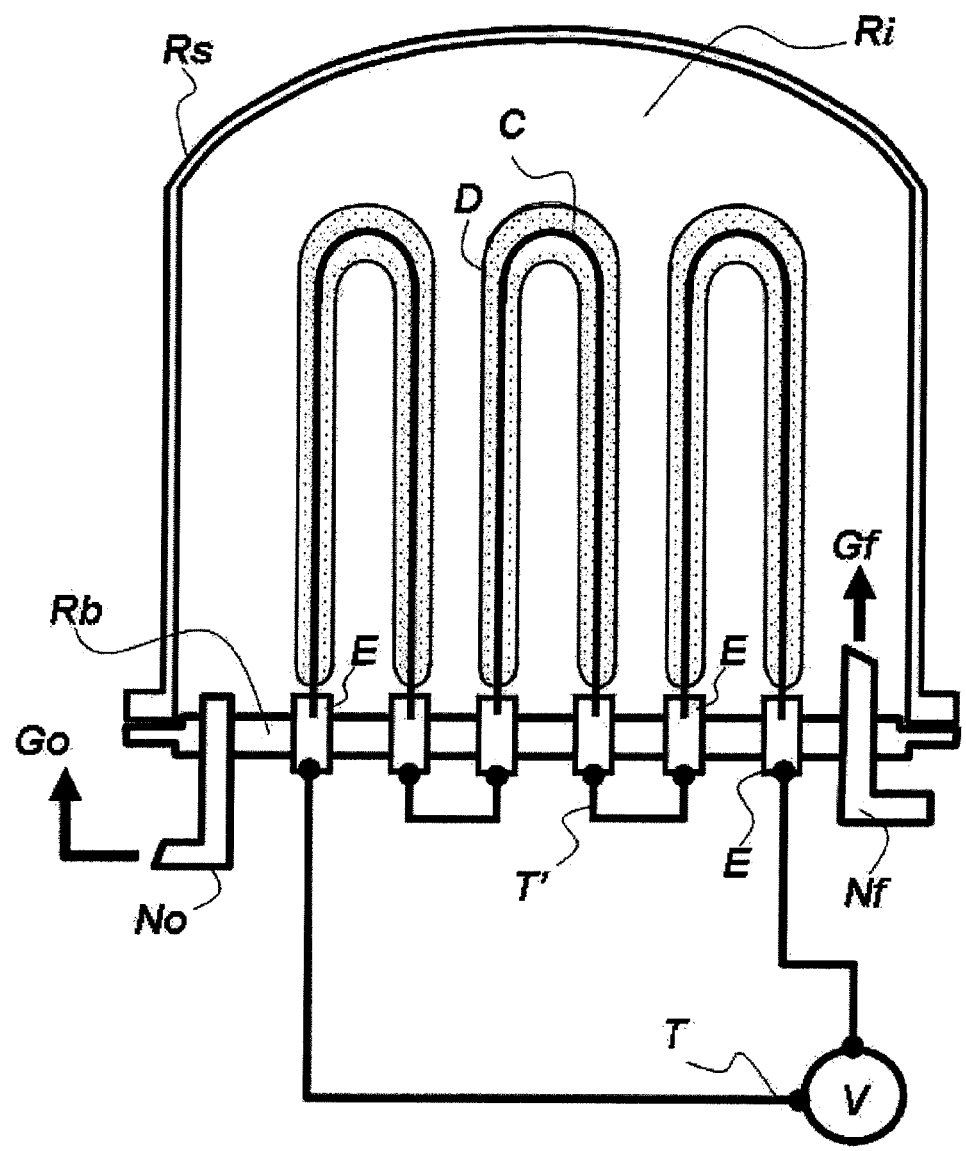

[Fig. 2]
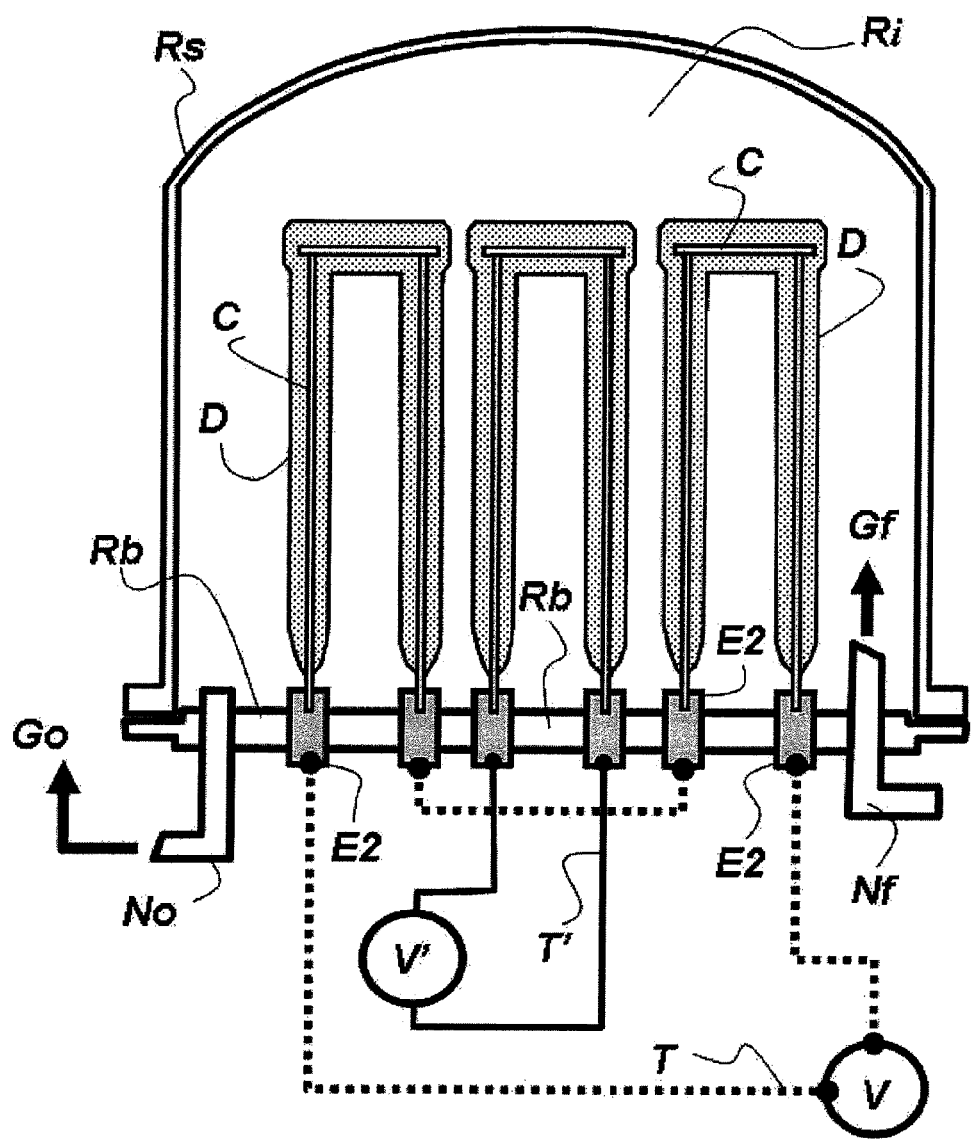

[Fig. 3]
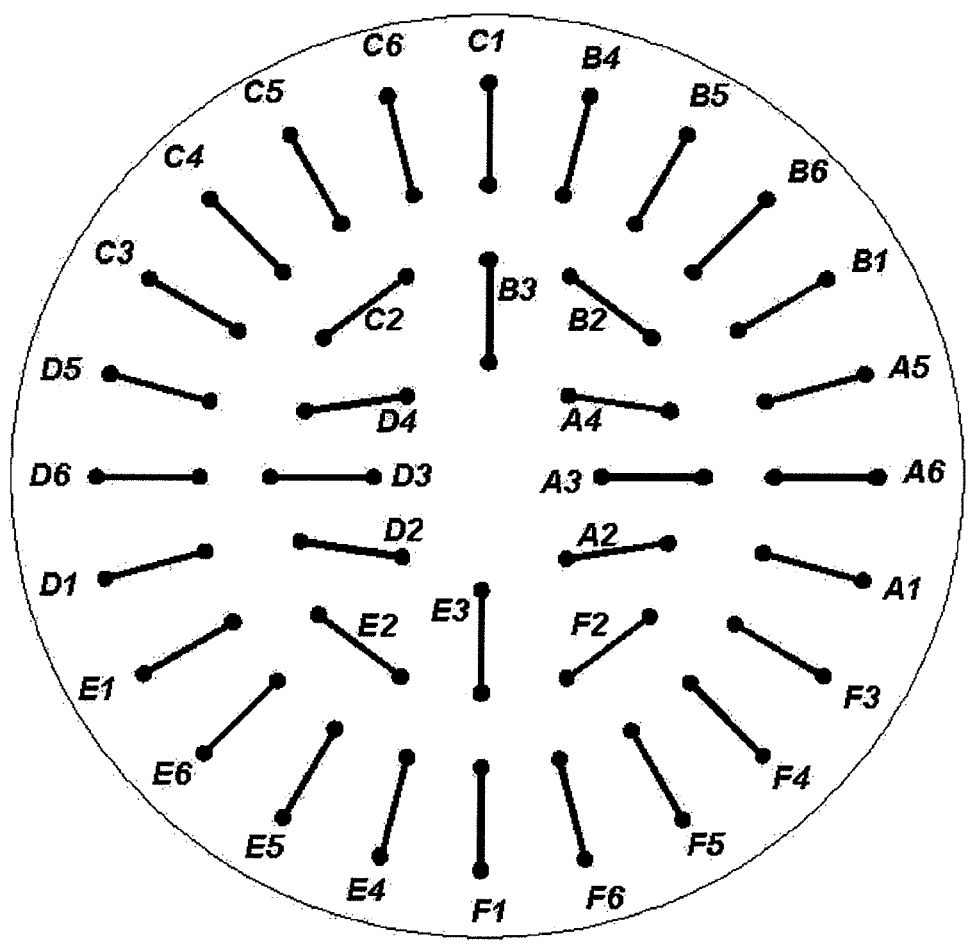

[Fig. 4]
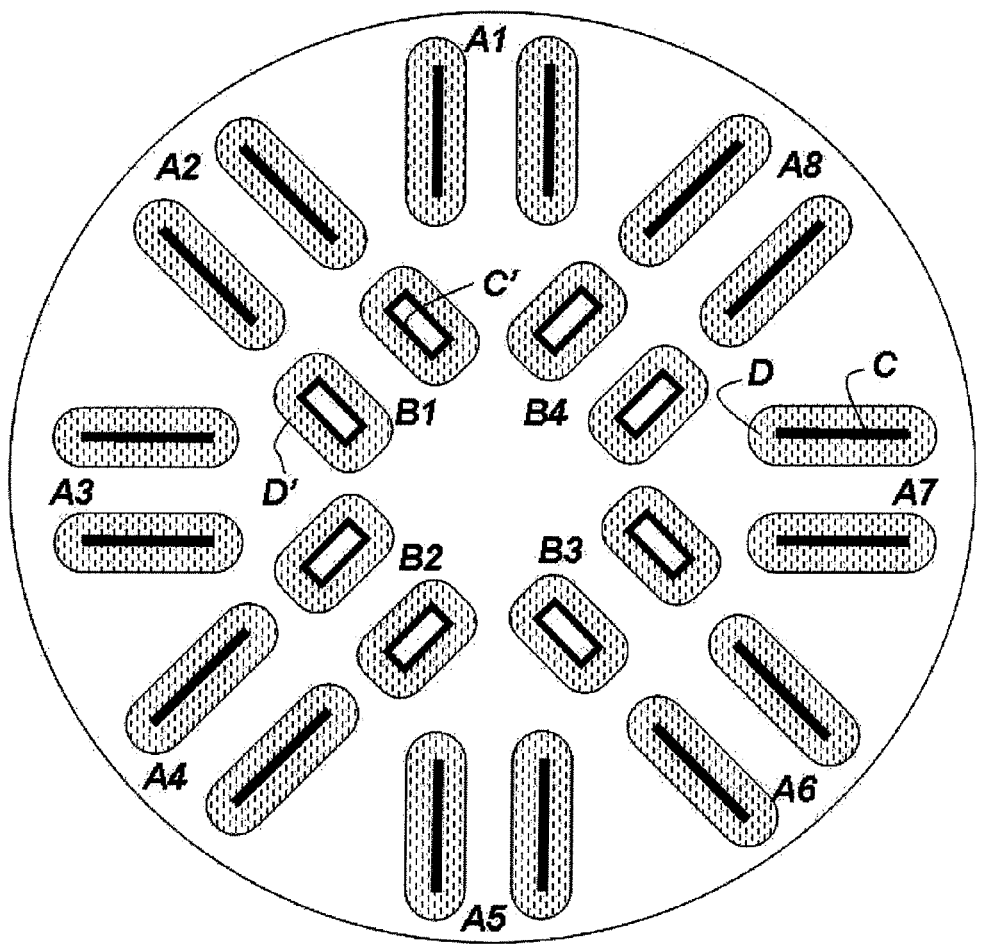

[Fig. 5]
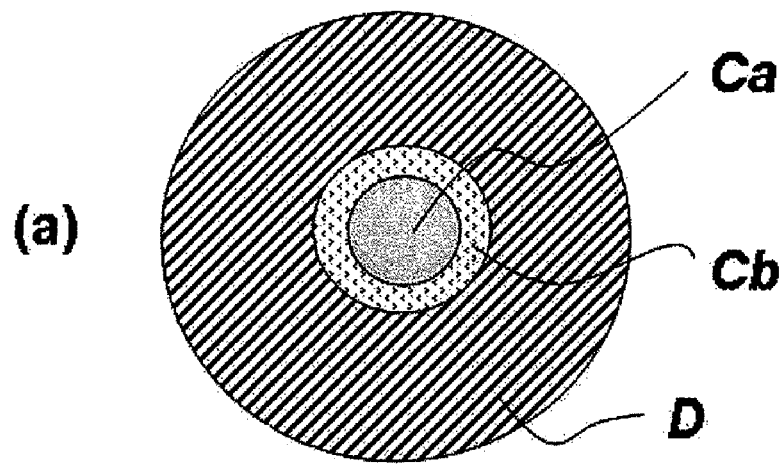
(a)
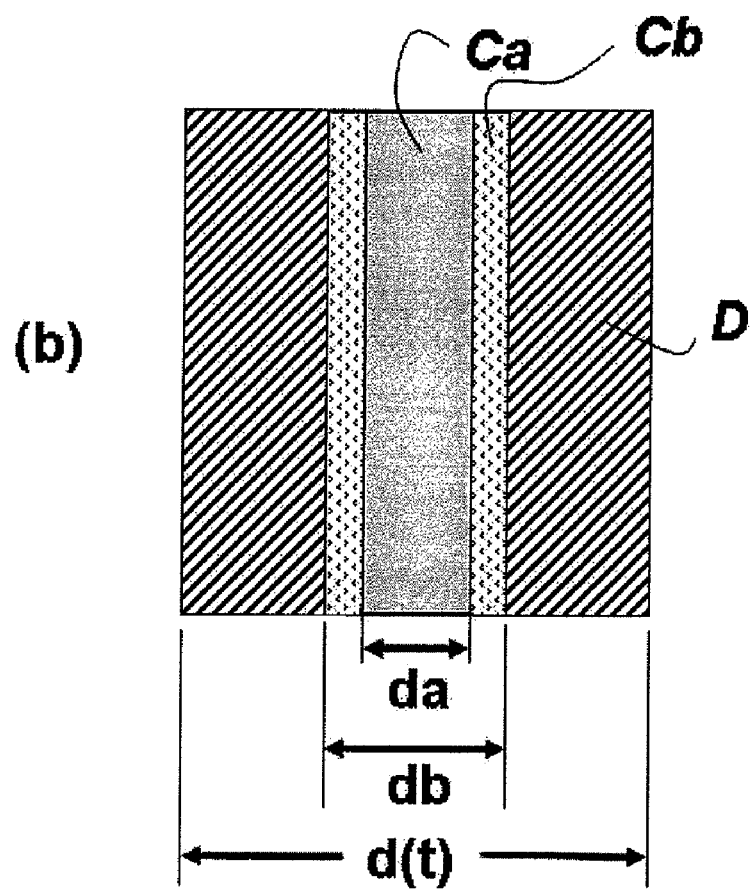
(b)

[Fig. 6]
(a)
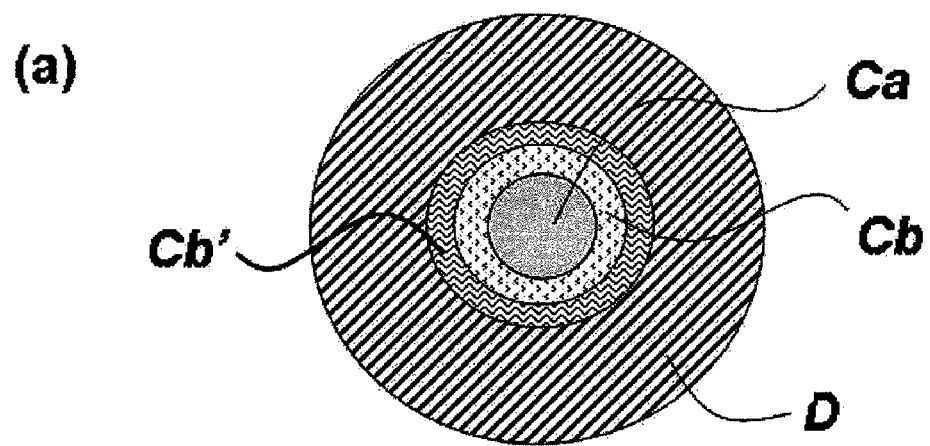
(b)
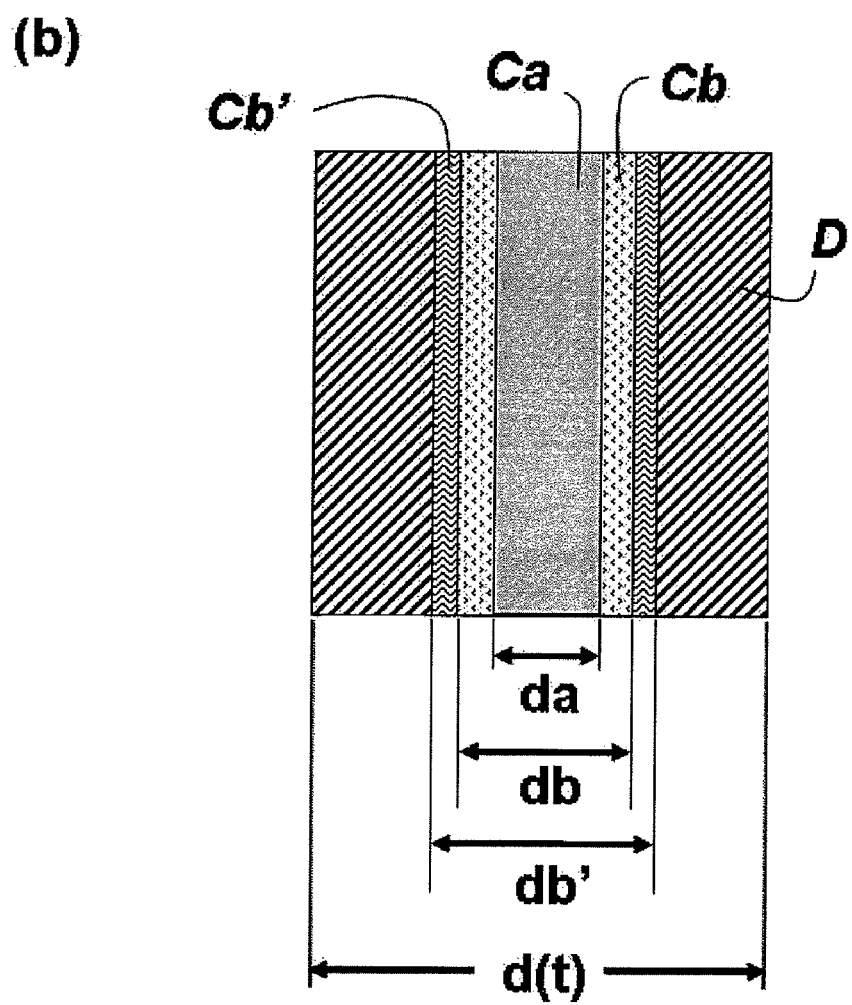

[Fig. 7]
(a)
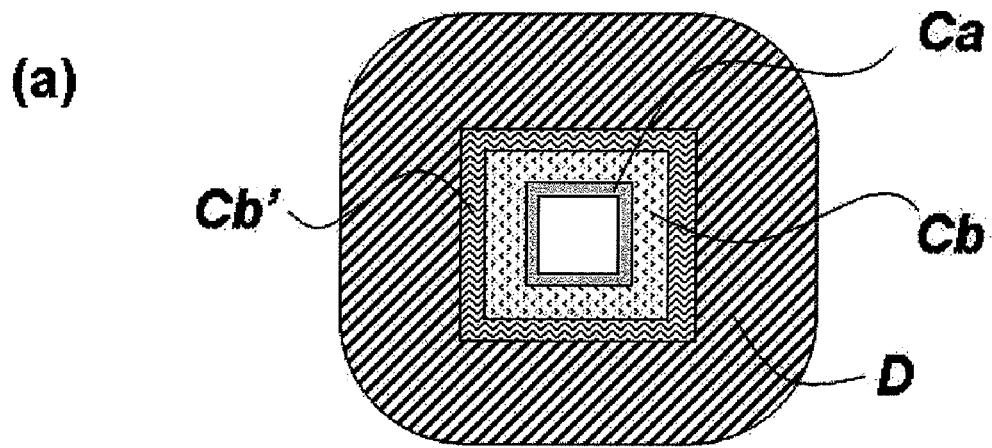
(b)
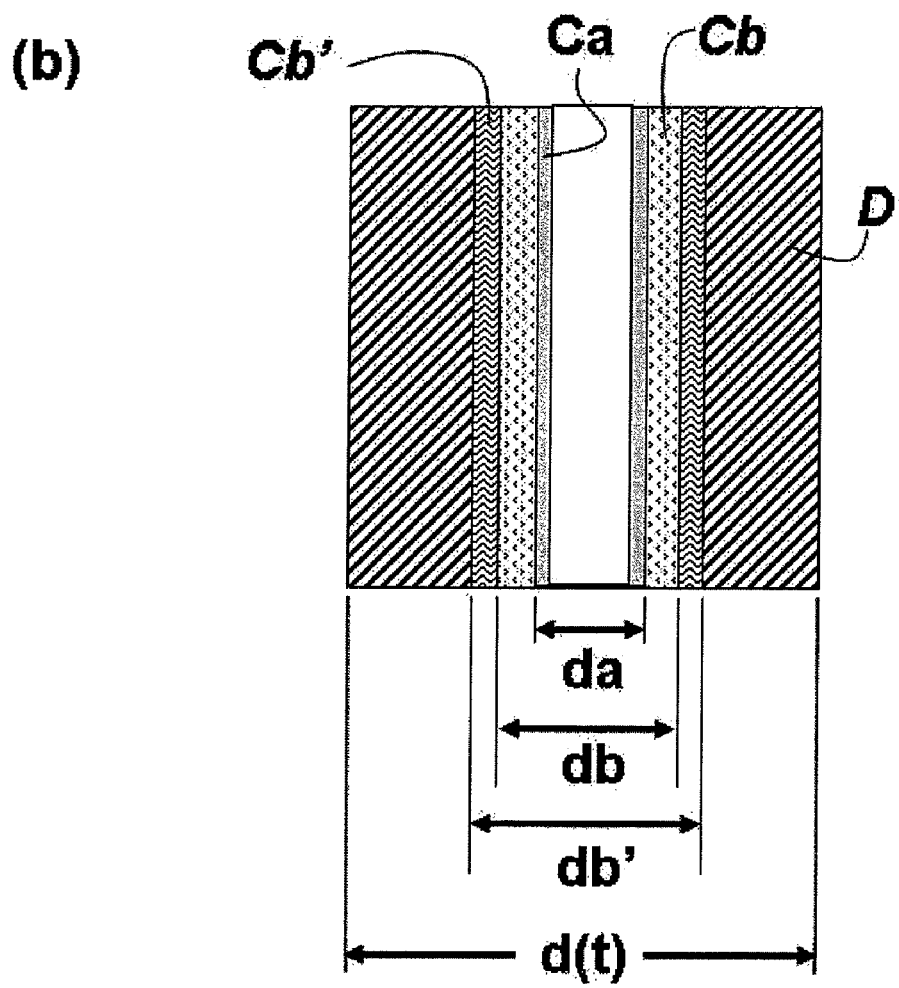

[Fig. 8]
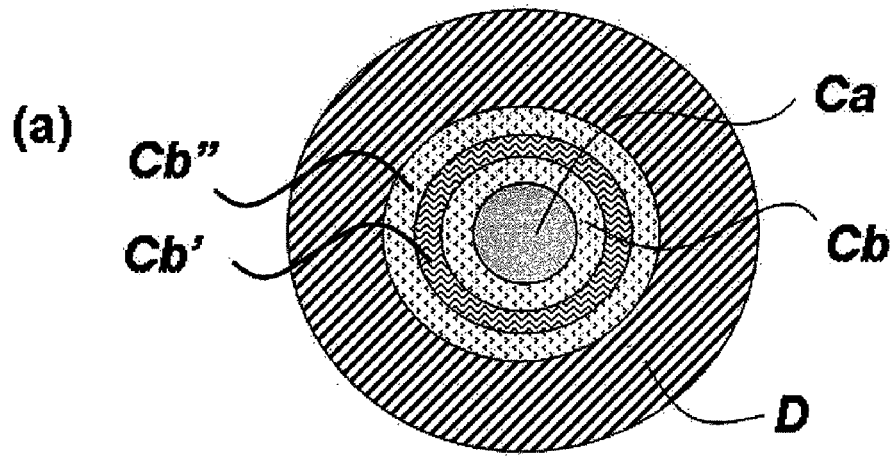
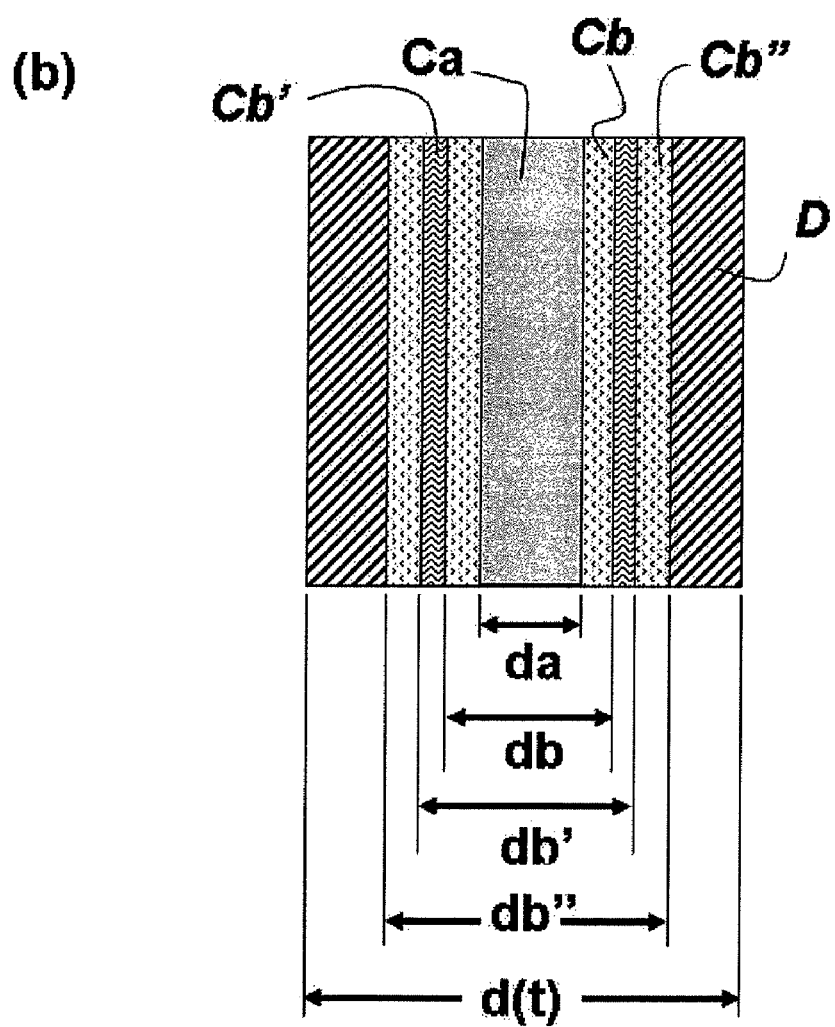

[Fig. 9]
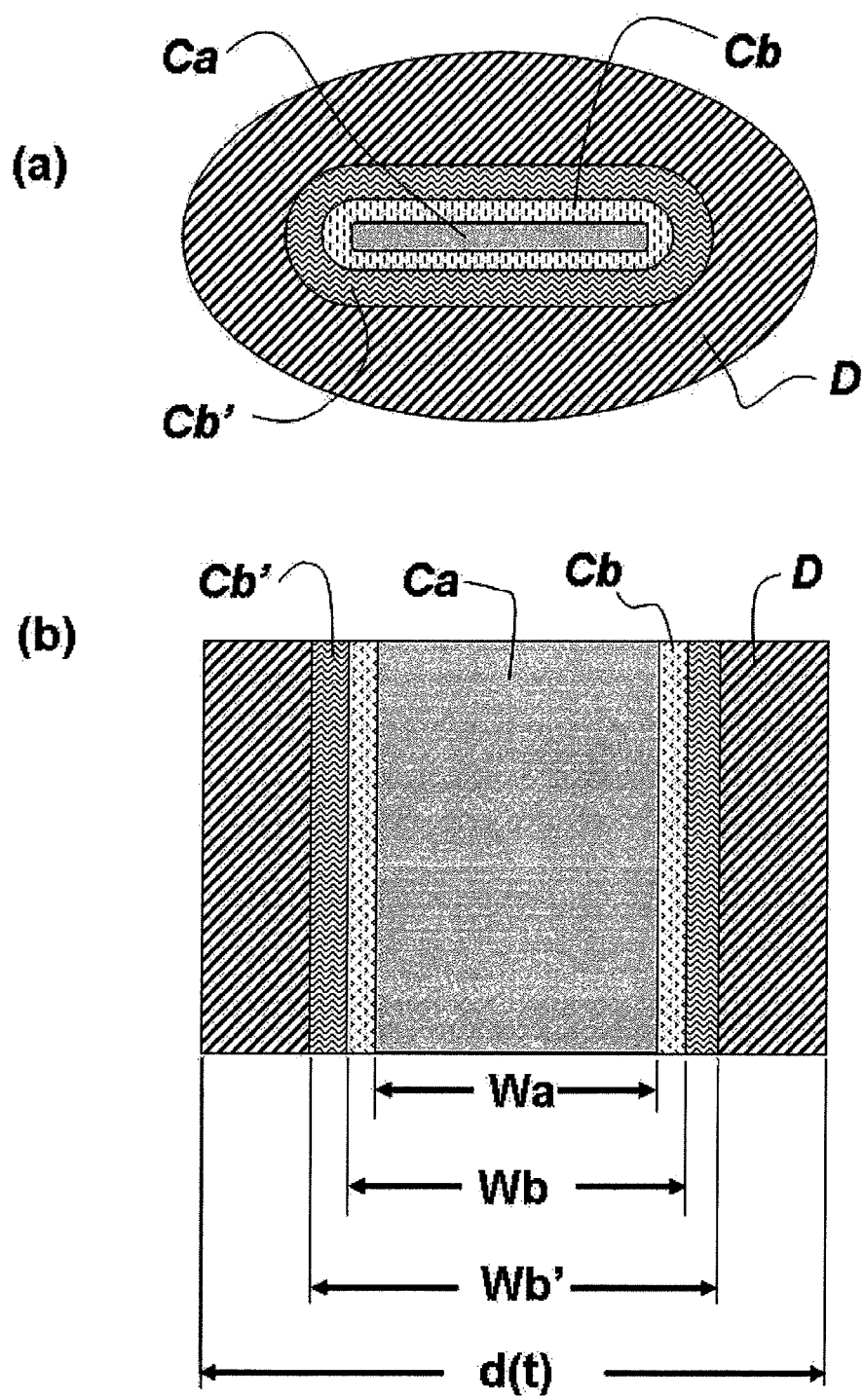

METHODS FOR PREPARATION OF HIGH-PURITY POLYSILICON RODS USING A METALLIC CORE MEANS

This application is a continuation of U.S. patent application Ser. No. 12/160,837 filed Jul. 14, 2008 which is a 371 of PCT/KR2007/2457 filed on May 21, 2007, published on Nov. 29, 2007 under publication number WO 2007/136209 A1 which claims priority benefits from South Korean Patent Application Number 10-2006-0045707 filed May 22, 2006. The disclosures of all these applications are hereby incorporated by reference.

TECHNICAL FIELD

The present invention relates to a method for preparing rod-shaped polysilicon. More particularly, the present invention relates to a method which can minimize difficulties in constructing and operating an electrical heating system for heating a core means installed in a silicon deposition reactor used for bulk production of rod-shaped polysilicon (polycrystalline silicon, silicon polycrystal, multicrystalline silicon or poly-Si).

BACKGROUND ART

In general, high-purity polysilicon comprising polycrystalline structure is used as an important raw material for semiconductor devices, solar cells, chemical processing units, industrial systems, or small-sized and other highly integrated precision devices, which are respectively composed of a material with high purity or semiconducting properties.

The polysilicon is prepared using a silicon deposition method, wherein silicon atoms deposit continuously on the surface of silicon by thermal decomposition and/or hydrogen reduction of a highly-purified silicon atom-containing reaction gas.

For bulk production of polysilicon, a bell-jar type, a tube-type or a chamber-type deposition reactor has been mainly used. According to the deposition reactor, polysilicon is prepared generally in the shape of a rod with a circular or oval cross-section whose diameter is in the range of about 50-300 mm.

In the deposition reactor, a core means is basically installed for preparation of the silicon rod. For commercial production, the core means is composed of a plurality of core units respectively made of a core material (i.e., core element), through which electricity can flow at a deposition reaction temperature. The core units constituting a core means are connected to electrode units, respectively, to complete an electrical heating means in the reactor shell. Then, silicon deposits continuously on the surface of the electrically heated core means by a deposition reaction of a reaction gas comprising a silicon-containing component. As described above, the silicon deposition output is formed and enlarged in a thickness direction, that is, in an outward, radial direction of the concentric cross-section of the deposition output, and thus a rod-shaped polysilicon product can be obtained finally.

To obtain a high-purity product with minimized impurity contamination, the core units represented by a core means may be made of or fabricated with a non-contaminating core element. An ideal material for the core element is high-purity silicon that is formed like a rod, a wire or a filament, a hollow duct or a tube, a strip or ribbon, a sheet, etc.

The polysilicon rods obtained finally by forming the deposition output around the core means are (i) divided or pulverized into the shape of chunks, nuggets, chips or particles, (ii) grouped according to size, (iii) subject to an additional step of cleaning, if required, to remove impurity components formed on the surface of silicon fragments during the pulverizing step, (iv) melted in a crucible which is heated above the melting point of silicon, and then (v) formed into an ingot, a block, a sheet, a ribbon or a film, etc., according to a use thereof.

An electrical heating means constructed within the deposition reactor shell consists of a core means which is electrically heated and an electrode means electrically connecting the core means to an electric power supply source located outside of the shell and/or electrically connecting the core units with each other. This electrical heating means serves to provide (i) an electrical heating required for maintaining a deposition reaction temperature, (ii) a starting substrate for silicon deposition, and (iii) a mechanical structure for stably supporting the silicon rod that grows in diameter and weight as the deposition continues.

Each of the core units constituting the core means should be made of or fabricated with such a core element material that satisfies the function and role of the core means. To achieve this purpose, (i) a high-purity silicon is melted alone or with a dopant component, (ii) the silicon melt is subject to crystal growing or casting, and (iii) the core element is prepared through a forming process and/or a machining process, thereby shaping its cross-section into a circle, an oval, a concentric circle or a polygon, a triangle, a tetragon, a hexagon, etc.; its diameter or diagonal length may be in the range of about 3-30 mm or 5-100 mm, respectively, with its length being about 0.5-6 m.

There are several ways in preparing the core element. Each piece of the core element may be prepared in a sequential manner. Or, a plurality of core elements with a uniform size and shape may be prepared simultaneously by simply cutting a large-sized single crystal ingot. Further, a long silicon core element may be prepared by melt connection of a plurality of short pieces of core element under a clean atmosphere.

According to the description in the reference document of W. C. O'Hara, R. B. Herring and L. P. Hunt, "Handbook of Semiconductor Silicon Technology", pp. 46-48, Noyes, Publication, 1990, preparing a core element made of the high-purity silicon material, such as a core rod, a slim rod or a starter filament having a small diameter, entails a great deal of economical and technological burden in a process of preparing polysilicon rod using the deposition reactor. When the core element is made of a high-purity silicon, whose resistivity is extremely high at room temperature and drastically decreases with temperature increase, the core means begins to be electrically heated due to the occurrence of an apparent current through each core unit connected and fixed to a pair of electrode units only after the core units constituting the core means are preheated to a certain temperature or above by an additional heating means for lowering sufficiently the value of silicon resistivity. As disclosed in U.S. Pat. Nos. 4,179,530 (1979) and 5,895,594 (1999), preheating the core means for preparing a polysilicon rod requires a separate, additional preheating means and a complicated procedure.

Meanwhile, U.S. Pat. Nos. 3,941,900 (1976) and 4,215,154 (1990) disclose a technical solution to apply a direct electrical resistive heating to a core means starting from room temperature using a properly constructed electric power supply system, instead of preheating the high-purity silicon core element with a separate, additional preheating means. However, this method also has drawbacks that such an electric power supply circuit and system is highly sophisticated and costly, and requires very complicated and precise operation and control.

Unlike those methods by which the core means is preheated by a separate preheating means or is heated directly at room temperature by resistive heating using a sophisticated power supply system, incorporating a high concentration of n- or p-type dopant artificially in the silicon core element to greatly lower the resistivity enables to electrically heat up the core means directly at room temperature with high-voltage electricity. After being heated up to a predetermined temperature range, the core means can be easily heated as required with low-voltage and high-current electricity. This method has a drawback that it requires a complicated electric power supply means and a precise operation over a wide range of voltage and current.

On the other hand, if the core element is made of a non-silicon resistive material such as a metal or a carbon-based material with a resistivity value much lower than that of silicon, a silicon deposition output formed on an individual core unit can be contaminated by the impurity components generated and diffused from the core element made of a non-silicon material. However, there is an advantage that, by supplying a low-voltage electricity, the core means can be easily heated up by a resistive heating from room temperature over a deposition reaction temperature without a separate, additional preheating step. According to U.S. Pat. Nos. 5,277,934 (1994) and 5,284,640 (1994), tungsten or tantalum can be used as the core element instead of silicon. Meanwhile, U.S. Pat. No. 5,327,454 (1994) illustrates a core element made of molybdenum, tungsten or zirconium instead of high-purity silicon material.

The non-silicon core means made of a resistive material as described above can be prepared conveniently and cost-effectively. However, the deposition output obtained by silicon deposition cannot avoid being contaminated by the impurity components contained in the non-silicon core element for each of the core units constituting the core means. Thus it is difficult to apply the above method of using a non-silicon core means to a commercial production of a high-purity polysilicon rod because the purity requirement on the semiconductor-grade quality has recently become further stringent. Such a fundamental problem has also been confirmed in the prior art, as described in the above reference document (1990) of O'Hara et al. In the event a wire-type non-silicon, metallic core unit is used for the core means instead of the silicon-based core means, there is an advantage that a silicon rod product can be obtained rather conveniently. However, this method also has several disadvantages: first, when the silicon rod is finally formed as required, the deposition output and the core means included in the silicon rod should be separated from each other for the deposition output to be collected as silicon product; secondly, the deposition output formed through the silicon deposition process at high-temperature should probably be contaminated by the impurity components out of the metallic core element.

To prepare high-purity polysilicon at a reasonable cost based on the bell-jar deposition process without any difficulties in the preheating of the silicon core means, it is worthwhile to apply a non-silicon, resistive material for the core element by solving the problems caused by the replacement of the core material; the problems may include a difficult step for separating the core means out of the silicon rod output for collecting the silicon deposition output as product as well as a probable product contamination by the metallic impurity components out of the non-silicon core material. However, despite the importance of the preheating of the core means, there has not been yet available a simple, cost-effective solution to overcome those problems arising in applying the non-silicon core means.

As described above, to develop an improved method in preheating the core means in the bell-jar type reactor is an important technical issue for commercial bulk production of polysilicon in the form of a rod. The technical solutions required for the improvement should reduce investment costs for an electric power supply and control system and a process for preparing and machining the core means, allow an easy operation and control of the deposition reactor, enhance the reactor productivity, and ultimately lower the preparing cost.

DISCLOSURE OF THE INVENTION

Accordingly, an objective of the present invention is to solve the problems arising when a core means is constituted by using a metallic core element to enable an electrical heating required for silicon deposition to initiate and to enable the core means to support structurally a silicon deposition output in a deposition reactor for preparing rod-shaped polysilicon. Therefore, an objective of the present invention is to minimize the contamination of the deposition output caused by impurity components of the metallic core element in the process of silicon deposition at high temperature by forming a separation layer on a surface of the metallic core element.

Another objective of the present invention is to enable an easy separation of the core means and the deposition output from a silicon rod output after completing the silicon deposition process.

In addition, unlike the conventional deposition reactor in which a core means made of a high-purity silicon material should be preheated through a separate preheating process and then its electrical heating can be started, a further objective of the present invention is to heat up electrically the core means in a simple, straightforward manner from room temperature without any preheating process.

A still further objective of the present invention is to prepare cheaply a high-purity polysilicon rod, which can be used for semiconductor devices or solar cells, by using a deposition reactor designed and constructed in a simpler manner based on a metallic core element, whose physical properties are superior to that of a silicon material.

In order to achieve the above mentioned objectives, the present invention provides a method for preparing a polysilicon rod using a metallic core means comprising the steps of installing a core means in an inner space of a deposition reactor used for preparing a silicon rod, wherein the core means is constituted by forming one or a plurality of separation layer(s) on the surface of a metallic core element and is connected to an electrode means; heating the core means by supplying electricity through the electrode means; and supplying a reaction gas into the inner space for silicon deposition, thereby forming a deposition output in an outward direction on the surface of the core means.

Here, the reaction gas contains at least one silicon-containing component selected from the group consisting of monosilane ($SiH_4$), dichlorosilane ($SiH_2Cl_2$), trichlorosilane ($SiHCl_3$), silicon tetrachloride ($SiCl_4$) and a mixture thereof.

Here, the reaction gas further contains at least one gas component selected from the group consisting of hydrogen, nitrogen, argon, helium, hydrogen chloride, and a mixture thereof.

Also, the silicon deposition occurs in the inner space at a reaction pressure in the range of 1-20 bar absolute and a reaction temperature in the range of 650-1,300° C. based on the surface temperature of the deposition output.

In addition, the metallic core element has a shape selected from the group consisting of a rod, a wire, a filament, a bar, a strip and a ribbon having a cross-sectional shape of a circle, an oval or a polygon, and of a conduit, a tube, a cylinder, and a duct having a cross-sectional shape of a concentric circle, a concentric oval or a concentric polygon.

Also, the metallic core element is a metal or an alloy comprising at least one metal element selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), ferrum (Fe), nickel (Ni), aluminum (Al) and a mixture thereof.

Further, the number of the separation layer(s), each made of a different barrier component, is in the range of 1 to 5.

In particular, a barrier component constituting each layer of the separation layer(s) is selected from the group consisting of silicon nitride, silicon oxide, silicon carbide, silicon oxynitride and a mixture thereof.

Also, the barrier component constituting each layer of the separation layer(s) is selected from a nitride, an oxide, a silicide, a carbide, an oxynitride or an oxysilicide comprising at least one metal element selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), and a mixture thereof.

Also, the overall thickness of the separation layer(s) is in the range of 10 nm to 20 mm.

In particular, the method according to the present invention further comprises the step of adding a silicon layer to the separation layer(s), wherein the silicon layer has a thickness in the range of 1 μm-10 mm and the silicon is selected as the barrier component.

Here, the silicon layer is added to the separation layer(s) in a state that the metallic core means and the electrode means are connected to each other and installed in the inner space of the deposition reactor, the metallic core means is heated by supplying electricity through the electrode means, and a feed gas for forming the silicon layer is supplied into the inner space of the deposition reactor at a reaction condition, wherein the feed gas is selected from the components of the reaction gas for forming the deposition output in preparing the polysilicon rod, and the reaction condition is provided so that the silicon layer and the deposition output can be different each other in terms of crystal structure and thermal expansion.

And, the metallic core element and the electrode means are connected to each other and installed in the inner space of the deposition reactor, the metallic core element is heated by supplying electricity through the electrode means, a feed gas for forming the separation layer(s) is supplied into the inner space, and the separation layer(s) is/are formed, thereby the core means being prepared.

In particular, a preliminary core means, prepared in advance by forming part of the separation layer(s) on the metallic core element, and the electrode means are connected to each other and installed in the inner space of the deposition reactor, the preliminary core means is heated by supplying electricity through the electrode means, a feed gas for forming an additional separation layer(s) is supplied into the inner space, and an additional separation layer(s) is/are formed, thereby the core means being prepared.

Also, the core means is prepared by assembling a separation layer prepared in advance together with the metallic core element in such a manner that the separation layer can encompass the metallic core element.

BRIEF DESCRIPTION OF THE DRAWINGS

The above objectives, other features and advantages of the present invention will become more apparent by describing the preferred embodiment thereof with reference to the accompanying drawings, in which:

FIG. 1 is a structural view schematically showing a structure of the deposition reactor capable of preparing polysilicon rod according to the present invention;

FIG. 2 is a structural view schematically showing another structure of the deposition reactor capable of preparing polysilicon rod according to the present invention;

FIG. 3 is a plane view showing schematically an embodiment in which the core mean is divided into six kinds of core groups and the core groups are disposed according to the present invention;

FIG. 4 is a plane view showing schematically an embodiment in which the core mean consisting of the core units having different two section surfaces is divided into two kinds of core groups and the core groups are disposed according to the present invention and a shape the deposition output formed through the above conditions;

FIGS. 5 to 9 are cross-sectional views (a) and longitudinal sectional views (b) showing schematically the states that a silicon deposition output is formed in an outward direction on the surface of the core means constituted by forming a separation layer on the surface of a core element according to the present invention;

FIG. 5 is an illustrative view showing the process of forming the deposition output in an outward direction on the surface of the core means constituted by forming one separation layer on the surface of the rod-shaped metallic core element having a circular cross-section;

FIG. 6 is an illustrative view showing the process of forming outward the deposition output on the surface of the core means constituted by forming two kinds of the separation layers on the surface of the rod-shaped metallic core element having a circular cross-section;

FIG. 7 is an illustrative view showing the process of forming outward the deposition output on the surface of the core means constituted by forming two kinds of the separation layers on the surface of the conduit shaped or tube shaped metallic core element having a concentric rectangular cross-section;

FIG. 8 is an illustrative view showing the process of forming outward the deposition output on the surface of the core means constituted by forming three kinds of the separation layers on the surface of the rod-shaped metallic core element having a circular cross-section; and FIG. 9 is an illustrative view showing the process forming outward the deposition output on the surface of the core means constituted by forming two kinds of the separation layers on the surface of the plate shaped metallic core element having a rectangular cross-section.

BEST MODE FOR CARRYING OUT THE INVENTION

Reference will now be made in detail to a preferred embodiment of the present invention, examples of which are illustrated in the accompanying drawings.

The present invention can be applied to all the deposition reactors used for preparing polysilicon in the form of a rod regardless of a shape and structure of the deposition reactor such as bell-jar type, a tube type or a chamber-type. Since the bell-jar type deposition reactor which is also referred to as the Siemens reactor has most widely been used for commercial purpose, the present invention will be described with reference to such bell-jar type deposition reactor (hereinafter, referred to as "bell-jar type reactor") in this specification.

As shown schematically in FIG. 1 or FIG. 2, the bell-jar type deposition reactor comprises a sealed inner space Ri, formed by a shell Rs and a base unit Rb, and a core means C consisting of one or a plurality of core units installed in the inner space Ri.

The core units, mechanically fixed on corresponding electrode units, are electrically connected to each other by electrode units E to be represented by an electrode means E. Electric power is supplied to the electrode means E through an electric power transmitting means T from an electric power supply source V installed outside the shell Rs and the base unit Rb.

In a small, laboratory-scale deposition reactor, a core means consists of only one or a small number of core units, and each core unit is connected to a pair of electrode units at its both ends. Otherwise, in a deposition reactor used for a large-scale commercial production of polysilicon, the core means C consists of several tens to several hundreds of core units, which have conventionally been the same with each other in material or shape.

The keywords and descriptions in the present invention are based on the following definitions: the "core means" indicates a group of one or a plurality of "core units" constituting a substrate that is the starting point of the formation of the silicon deposition output caused by a deposition reaction; and each core unit is composed of, constituted by, or fabricated from the material to be represented by the "core element".

And, since a plurality of identically grouped core units can be connected electrically to each other in series and/or in parallel, and the silicon deposition can occur almost in the same manner on the identically grouped core units, the operation method and a phenomenon or a characteristic observed on an individual core unit may be collectively described in terms of a "core means" representing a group of the core units which are identically grouped in the present invention.

Once the core means C is electrically heated above the temperature required for silicon deposition and the reaction gas Gf is supplied into the inner space Ri, the silicon deposition initially starts on surfaces of the core means C. Then, silicon the deposition output D is formed in an outward direction on the core means C, with polysilicon being ultimately prepared in the form of a rod. In this process, each core unit also behaves as a structural frame of the respective polysilicon rod to be obtained by the reactor operation.

In the conventional deposition reactor, according to the prior art, the core means is prepared in the form of a thin silicon filament, which is also called a slim rod or a silicon core rod. This thin material can directly be pulled from a high-purity silicon melt in the form of a thin polycrystalline or single crystalline rod. Otherwise, a plurality of the silicon core rods can be obtained simultaneously by machining a large polycrystalline or single crystalline silicon ingot to a predetermined core size. The core units, made thereof and represented as the core means C, is connected to the corresponding electrode units represented by an electrode means E. If consisting of the high-purity silicon core rods with a very high resistivity at room temperature is used as, the core means is installed within a large, bell-like dome called the "bell-jar" made of quartz so that the reactor shell Rs made of a metallic material can surround the silicon core rod. Further, a preheating means installed additionally between the quartz bell-jar and the reactor shell Rs for preheating a plurality of core rods to a temperature of about 350-400° C. or above at which the resistivity becomes lowered to about 2-5 ohm-cm or below. Then, the core means starts to be heated electrically by supplying electricity via the electrode unit E with the potential difference imposed on the core means being decreased consecutively with temperature increase. Therefore, this preheating process requires the configuration of the deposition reactor to be more complicated than that of the reactor illustrated in FIG. 1 or FIG. 2.

On the other hand, if the silicon core rod is highly contaminated with a large amount of impurity components for greatly lowering the resistivity, or if the core element is composed of a resistive metallic material, it is possible to electrically heat up the core means C directly from room temperature by supplying electricity via the electrode means E without additionally installing the quartz bell-jar and/or a separate preheating means within the shell Rs of the reactor. This enables the geometry of the deposition reactor to be simplified as illustrated in FIG. 1 or FIG. 2. However, a silicon deposition output formed outwardly on such a core means should possibly be contaminated by the impurity components migrating out of the resistive core means. It is therefore difficult to use such a highly contaminated silicon or resistive metallic material as the core element as mentioned above for preparing a polysilicon output that requires a high degree of purity.

Instead of selecting a high-purity silicon, a highly contaminated silicon and a resistive metallic element as the core element material for the core means C, the present invention is characterized in that, as illustrated in FIG. 5 to FIG. 9, the core means C is constituted by forming one or a plurality of separation layer(s) Cb on the surface of a metallic core element Ca.

In the present invention, regardless of the formation of the separation layer on a surface of the metallic core element, the resistive material-based metallic core element Ca constituting the core means C can be electrically heated easily and rapidly from room temperature to a reaction temperature required for the deposition reaction by introducing an electric current into the electrode means E at a moderate potential difference. Here the electric power is supplied from the electric power supply source V, installed outside the deposition reactor, to the electrode means E through an electric power transmitting means T.

Therefore, the present invention comprises the steps of installing a core means C in an inner space Ri of a deposition reactor used for preparing the silicon rod, wherein the core means C is constituted by forming one or a plurality of separation layer(s) Cb on the surface of a metallic core element Ca and is connected to an electrode means E; heating the core means by supplying electricity through the electrode means E; and supplying a reaction gas Gf into the inner space Ri for silicon deposition, thereby forming a deposition output D in an outward direction on the surface of the core means C.

In the process of electrically heating the core means C from room temperature to a required reaction temperature, no special constraint is imposed on pressure in the inner space Ri. Instead, at high vacuum requiring much more sophisticated set up, the heating can be executed at a normal pressure. Otherwise, the pressure may be selected in advance in the range of 1-20 bar absolute where the operation of silicon deposition will be executed. However, the present invention is not limited thereto.

In such a heating process, it is preferred to maintain the inner space Ri under an atmosphere selected from the group consisting of hydrogen, nitrogen, argon, helium and a mixture thereof. The gas selected for maintaining the atmosphere may be introduced into the inner space through the gas supply means Nf or an additional gas supply means.

Further, during the process of electrically heating the core means C even before its heating up to the reaction temperature, the reaction gas Gf may be supplied through the gas supply means Nf or an additional gas supply means to initiate the deposition reaction. However, the present invention is not limited thereto.

While a temperature of the core means C is maintained within a desired reaction temperature range, silicon deposition proceeds in an outward direction on the surface of the core means C by the reaction gas Gf supplied through the gas supply means Nf comprising one or a plurality of gas supply nozzle(s).

The reaction gas Gf used in the present invention gas contains at least one silicon-containing component selected from the group consisting of monosilane ($SiH_4$), dichlorosilane ($SiH_2Cl_2$), trichlorosilane ($SiHCl_3$), silicon tetrachloride ($SiCl_4$) and a mixture thereof. Pyrolysis and/or hydrogen reduction of the silicon-containing component leads to silicon deposition that forms the silicon deposition output D.

Although being composed of only the silicon-containing component for preparing the rod-shaped polysilicon, the reaction gas Gf may further contain at least one gas component selected from the group consisting of hydrogen ($H_2$), nitrogen ($N_2$), argon (Ar), helium (He), hydrogen chloride (HCl), and a mixture thereof to control the characteristic of the deposition reaction and the composition of an off-gas Go.

In the present invention, the silicon deposition preferably occurs in the inner space at a reaction pressure in the range of 1-20 bar absolute and a reaction temperature in the range of 650-1,300° C. based on the surface temperature of the deposition output.

If the reaction pressure is less than 1 bar absolute, the deposition rate of silicon on the deposition output D and the reactor productivity becomes unfavorably low. If not, the higher the reaction pressure, the more advantageous the deposition reactor is with respect to productivity. This characteristic is more prominent especially when trichlorosilane is selected as the silicon-containing component than the case of monosilane. However, if the reaction pressure is maintained at a level exceeding 20 bar to remarkably increase the reactor productivity, serious problems are encountered as follows: the fabrication cost of the deposition reactor itself as well as the subsidiary units in connection with the reactor becomes excessive; it becomes more difficult to secure process safety; and the feed rate (moles/hr) of the raw material becomes too high for the surface temperature of the deposition output D to be maintained within an allowable reaction temperature range by the electrical heating of the core means C.

Based on convenience and reliability in temperature measurement and considering the facts that silicon should be continuously deposited on the surfaces of the deposition outputs in an outward direction on the core means C and surface temperatures are different according to the installed locations of the deposition output D in the inner space Ri, it is preferred that a temperature of the surface of the deposition output D is regarded as a standard of the reaction temperature.

Although a reaction temperature varies according to the composition of reaction gas Gf to be used, the rate of silicon deposition is significantly low or negligible at a temperature less than 650° C. with the reactor productivity being unfavorably low. Otherwise, the deposition rate increases with reaction temperature. However, at temperatures exceeding 1,300° C., the content of a component that cannot be recycled increases excessively in the off-gas Go. Also, the temperature of central parts of the core means C, that is, the temperature of the core elements exceeding 1,400□ may cause a collapse of the silicon rod during the deposition process, and an enormous heat loss through the reactor shell Rs. Therefore, it is recommended to set the reaction temperature representing an allowable temperature range for silicon deposition within the range of 650-1,300° C., considering the conditions such as compositions of the reaction gas Gf and the off-gas Go, pressure, silicon deposition rate, energy efficiency and the like.

In a batchwise process for preparing rod-shaped polysilicon according to the present invention, the diameter and surface area of the deposition output D, a heat load of the core means C, a heat loss through the shell Rs of the deposition reactor increase with operating time. It is then desirable to predetermine the operation conditions such as the feed rate and composition of the reaction gas Gf, the reaction temperature, the reaction pressure, the electric power supply and the like. It is also important to optimize the above conditions by changing them with operating time.

Although, depending on the reaction conditions, the production capacity of the silicon deposition reactor increases with the number of the core units constituting the core means C in the inner space Ri, i.e., the surface area of the deposition output D. Thus, the shell Rs of the deposition reactor can be designed and constructed so that several tens or several hundreds of the core units C as well as the corresponding electrode means E can be arranged and installed therein. However, the number of the core units C is not limited in the present invention.

The metallic core element Ca is the material constituting not only the central, major part of each of the core units represented as a whole by the core means C, but also a basic framework supporting mechanically the silicon rod output to be manufactured according to the present invention. Also, the metallic core element Ca is required to be installed so that a resistive heating can occur therein by its electrical connection to the electric power supply source V via the electrode means E. If these requirements are satisfied, no special constraints are needed on the shape of the metallic core element. However, considering the commercial availability, the metallic core element has a shape selected from the group consisting of a rod, a wire, a filament, a bar, a strip and a ribbon having a cross-sectional shape of a circle, an oval or a polygon, and of a conduit, a tube, a cylinder, and a duct having a cross-sectional shape of a concentric circle, a concentric oval or a concentric polygon.

For example, FIG. 5, FIG. 6 and FIG. 8 illustrate the metallic core element Ca in the shape of a rod or a wire or a filament having a cross-section of a circle. FIG. 7 illustrates a hollow shaped example of the metallic core element in the shape of a conduit or a tube or a duct having a hollow cross-section of a concentric rectangle. FIG. 9 illustrates the metallic core element in the shape of a strip or ribbon having a high-aspect-ratio cross-section of a rectangle whose ratio between the width and height (or thickness).

In the present invention, it is preferred that the melting point of the material of the metallic core element Ca used in constituting the core means is higher than the reaction temperature by about at least 500-1,000° C. and its resistivity is in the range of about 1 μohm-cm-0.1 ohm-cm, where the material of the metallic core element can be a metal or an alloy comprising at least one metal element selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), ferrum (Fe), nickel (Ni), aluminum (Al) and a mixture thereof.

As described above, the shape of the metallic core element can be selected from the group consisting of a rod, a wire, a filament, a bar, a strip and a ribbon having a cross-sectional shape of a circle, an oval or a polygon, and of a conduit, a tube, a cylinder, and a duct having a cross-sectional shape of a concentric circle, a concentric oval or a concentric polygon.

No special constraints are needed on the size of the metallic core element Ca, if it behaves as a basic framework supporting mechanically the silicon rod output to be manufactured, and is installed so that a resistive heating can occur therein by its electrical connection to the electric power supply source V via the electrode means E. However, in case of the metallic core element Ca with a circular cross-section, it's diameter is preferred to be in the range of 0.1-20 mm. Otherwise, a thickness of the hollow cross-section is preferred to be in the range of 0.1-10 mm. In case of the high-aspect-ratio cross-section, a thickness (or height) and a width thereof are preferred to be in the range of 0.1-10 mm and 1-200 mm, respectively.

Besides possessing excellent electrical properties for use in the present invention, the core element needs preferably to be selected among high-purity materials comprising organic or inorganic impurity components as less as possible. This can lead to a minimized impurity contamination of the deposition output D formed outwardly on the core element.

Meanwhile, based on a longitudinal direction of a core unit, a piece of core element can be formed in a straight line-shape, U-shape, W-shape and the like, and its both ends can be fixed to and installed on a pair of corresponding electrode units E. The straight line-shape can be preferably employed for an easy application in a tubular- or a chamber-type deposition reactor. The W-shape is employed popularly for resistive electrical heaters; the W-shape core element installed and fixed on a pair of electrode units can advantageously be prepared sufficiently long as required, but unfavorably requires a precautions design to withstand the weight of the deposition output D increasing with deposition time.

The core units can also be installed so that a U-shaped (hereinafter, referred to as the "single body type") core unit C can be well fixed to a pair of corresponding electrode units E as illustrated in FIG. 1. Also, as illustrated FIG. 2, a pair of vertical core element parts and a horizontal core element part serving as a bridge connecting both upper ends of the vertical parts are assembled together to form an electrically connected core unit C (hereinafter, referred as the "assembled type"), which is well fixed to a pair of corresponding electrode units E.

The core units constituting an individual core means C can be prepared by directly forming a single core element like a single body type (U-shape) core unit, or a plurality of core element parts can be connected to each other to form the single body type (U-shape) core unit.

In the case of the assembled type core unit, where a core unit for the core means C consists of a plurality of straight line-shape core element parts, two vertical core element parts, which are mounted vertically on a pair of corresponding electrode units E, should be physically and electrically connected with the horizontal core element part serving as a bridge. This can be executed by: (i) mechanically processing a connecting portion of the core element parts; (ii) welding or connecting the connecting portion by using a welding means or plasma/arc; (iii) connecting the core element parts using a connection fitting or coupling aid such as a wire-shaped coupling material; or (iv) applying aforementioned methods in a combined manner.

In such an assembled type core unit, it is desirable for the vertical and horizontal core element parts to have the same material and same cross-sectional dimension. However, there is no problem in carrying out the present invention even though the vertical and horizontal core element parts are made of different materials and have different dimensions with each other. Here, their physical specifications, including a cross-sectional dimension, a length and the like, can be determined in relation to temperature-dependent electrical properties. It is further recommended to fabricate both ends of the vertical core element parts and thereby to enable an efficient coupling with the horizontal core element part.

In addition, although not illustrated in the drawings, the cross-section of the metallic core element Ca may vary along its longitudinal direction, but this does not deteriorate the extent of application of the present invention.

If the function and role of the core element, i.e., a basis of electrical heating and the basic mechanical frame supporting the enlarging silicon rod, are fulfilled without any problem, no constraints may be imposed on the length of a core element Ca between its both ends connected electrically to its corresponding electrode units E. However, considering a minimum production capacity, a difference among the shapes of the deposition outputs D depending on a location of the inner space Ri of the deposition reactor, a construction cost of the reactor, a weight of the silicon rod output to be handled after the deposition process, etc., the respective length of the metallic core element Ca may be selected in the range of 0.5-20 m.

At the step of determining the size and the length of the metallic core element Ca, the electrical heating characteristic according to the length and the cross-sectional area of the metallic core element Ca may be optimized in terms of the conditions of deposition reaction, the shape and weight of the silicon rod to be obtained, the reactor capacity and the like, to optimize the size and the length of the metallic core element.

Various shapes of the electrode means employed in the conventional bell-jar type reactor can be used in the present invention as they are. Each of the electrode units, represented by an electrode means E, may consist of all or part of the following elements: (i) an electrode made of a metallic conductive material with a low electrical resistance by which electrical self-heating is weak; (ii) an electrical coupling unit or an electrical connecting means which can interconnect mutually the electrode and the corresponding electric power transmitting means T such as a cable, a bar, a tube, a shaft, a conduit, a shaped article and the like for supplying an electric power: (iii) a coupling support or a chuck made of a carbon-based material, which electrically connects the core unit to the electrode or the electric power transmitting means T, with physically supporting each of the core units or fixing the electrode; (iv) a cooling means for cooling the electrode or the coupling support with a cooling medium such as gas, water, or oil and the like; (v) an insulating means for electrically insulating the metallic material constituting the shell Rs or the base Rb of the deposition reactor; and (vi) a part, a fitting and the like for coupling, sealing, insulating and assembling the elements as described hereinabove for constructing an individual electrode unit.

The shape and dimension of the corresponding electrode units of the electrode means E may be determined by considering a diameter of the silicon rod to be finally manufactured, the number and installation arrangement of the core units, a space available for installing all the required electrode units E, and their corresponding electric power transmitting means T, and a cross-sectional area of an electrode of the electrode unit by which electrical self-heating is weak.

It is permissible to install the electrode means E on either of the shell Rs or the base unit Rb of the deposition reactor. However, since a weight (load) of the silicon rod output exerted on the core means C and electrode means E should increase continuously with the reaction time, it may be advantageous in a structural aspect to install the electrode means E on the base unit Rb when the shapes of the core units to be installed are simple or linear as illustrated in FIG. 1 or FIG. 2. If the shape and the structure of a group of core units are designed so that each core unit can withstand the weight of the respective silicon rod outputs, it is permissible to install the electrode units E on either or both of the shell Rs and the base unit Rb which are equipped with a cooling means.

In the present invention, the electrode means E behave as electrical connecting means between an electric power supply system and the core means C. A pair of electrode units connected to each core unit serve as the input and output terminals of the single core unit. The construction of interconnections between the electrode units or the electrical circuit structure of the whole electrode units may be determined according to the installation arrangement, i.e., spatial layout of the core means C as well as the specifications predetermined for constructing their corresponding electric power supply systems.

The electrode units constituting the electrode means E and the corresponding electric power transmitting means T may be installed individually and then finally connected mechanically and electrically to each other. However, it is also allowable to design, fabricate and preassemble a plurality of electrode units E and the corresponding electric power transmitting means T as a more simplified and integrated body.

The coupling support and/or the electrical coupling unit constituting an electrode unit are generally made of a high-purity graphite material which can be easily fabricated. To prevent or reduce a carbon contamination of the silicon deposition output a layer of a functional ceramic material, such as silicon carbide, is often formed on the surface of such graphite-based elements. In assembly and installation of the electrode units an electrical insulation should be secured between such conductive elements and the metal-based shell Rs and/or base unit Rb of the deposition reactor.

During the reactor operation part of each electrode unit may be exposed to high temperature of the inner space Ri, by which the electrical insulating material or the sealing material installed can be protected from thermal degradation. Accordingly, it is preferred to cool some or the entire area of the base unit Rb, the electrode made of a metal material, the insulating parts and the like by using a circulated cooling medium.

Since several tens to several hundreds of core units are installed in the inner space Ri of the silicon deposition reactor according to the present invention, it is not desirable to dispose all the core units in series and/or parallel in constructing a power supply system for supplying electricity to the core units. Therefore, it is preferred that the electrode units E connected to the core means C be divided into one or a plurality of electrode group(s). Then electricity can be supplied independently to every electrode group, with the corresponding core units being electrically heated with a potential difference of about 100-200 volts or below and a current of about 1,000 amperes or below. Corresponding to the classification of the electrode group(s), a plurality of core units constituting the core means C are divided into one or a plurality of core group(s).

In the present invention, as applied to the core units, a plurality of core groups constituting the core means can be electrically interconnected to each other in series and/or parallel circuits as illustrated in FIG. 3 or FIG. 4. According to such connection scheme, the electric power transmitting means T for electrical connections of the electric power supply source V to the electrode units as well as of the electrode units to each other can be installed or assembled in the deposition reactor and the corresponding electric power supply system.

In a large-sized reactor shell Rs where a large number of core units can be installed, a considerable temperature difference may occur between the core units according to the location of their installation, depending on the construction of the electric circuit for power supply and the operation conditions. Further, this problem becomes more serious as the diameter of the deposition output D becomes larger. Thus, concerning the core groups or the corresponding electrode groups to be installed adjacent to the inner wall of the reactor shell Rs which is cooled to prevent silicon deposition thereon, installation arrangement of the deposition reactor and construction and operation of the electric power supply system need to be performed so that an additional heat loss from the deposition outputs D located adjacent to the reactor shell can be compensated.

In the present invention, the electric power transmitting means T electrically interconnecting the electric power supply source V and the electrode units E may be installed at an outside of the shell Rs and the base unit Rb of the deposition reactor. Further, the electric power transmitting means T or the electrical connecting means used for interconnecting the electrode units E can be installed at any locations, i.e., inside or outside the reactor provided that an appropriate electrical insulation is secured against the metallic material of the reactor. When installed at an outside of the deposition reactor, the electric power transmitting means may comprise a commercially available connecting means or a conductive metal such as a cable, a bar or a shaped body with a small electric power loss.

In case when, following an appropriate electrical insulation, the electric power transmission means T or the electrical connecting means is installed within the deposition reactor, for example, just above the base unit Rb for electrically connecting a plurality of electrode units E, a body fabricated for that purpose by machining a graphite material into a desired shape can be used on behalf of a metal material. To prevent generation of impurity components or fine powders, the surface of the graphite-based conductive body may preferably be subject to a physical and/or chemical processing to form a functional ceramic layer, such as silicon carbide (SiC) layer.

The electric power transmitting means T itself or the electrical connecting means itself used for interconnecting the electrode units can be regarded as an expanded electrode unit because they have something in common in that the electricity flows through such a large cross-sectional area as not to raise a remarkable resistance heating. Accordingly, a plurality of electrode units E as well as the electric power transmitting means T or the electrical connecting means for interconnecting the electrode units can be designed, fabricated and installed in the form of an integrated single body or an assembly of multiple integrated components. This method greatly reduces the space required for installing the electric power transmitting means T for a plurality of electrode units E installed above or below the base unit Rb, precludes elements of electrical contact resistance due to the connections between the electrode units and the corresponding electric power transmission means, allows an easy and convenient assembling and dismantling of the reactor, and enhances reliability in terms of safety.

A scheme how to electrically connect the electrode groups for each of the core means C determines how to constitute the electric circuits of the corresponding core groups as described above. If the electricity can be independently supplied to each of the electrode groups, the respective starting time of electrical heating can be set differently for each electrode group according to the present invention. It is also possible for the voltage-current condition for each of the core groups to be controlled differently from each other, if necessary.

The electric power supply system allowing an independent power supply to each of the electrode groups can be constructed so that the groups can be connected electrically in series and/or parallel circuits. Such an electrical scheme may be determined based on the electric power required in each core unit, the installation arrangement (spatial layout) and interconnection method of the electrode units, the specification of the electric power supply source, and the like.

The electric power supply source V comprises an electric power converting system having a function for converting an input electricity with a high voltage-low current characteristic into an output electricity with a low voltage-high current characteristic. In the present invention, the electric power supply source V can be constructed as a single integrated electric power converting system or as a plurality of electric power converting systems can be constructed in a separate, independent manner for every core group, that is, for every electrode group.

During the silicon deposition process the electrical heating of an individual core unit is subject to interdependencies between a current passing through the core unit and the corresponding silicon deposition output D, an electric resistance of them, and a potential difference imposed between a pair of corresponding electrode units. Based on the electricity characteristic it is possible to control with time the rate of electrical heating of each core means, each core group or each core unit. This can be achieved by the operation and control of the electric power supply source V as described above with either voltage or current being selected as the control parameter.

The electric power supply source V for one deposition reactor can possibly be assigned to another core means C comprised in another deposition reactor. In this case, one or a plurality of the core means C comprised in one or a plurality of deposition reactor(s), including the corresponding core group(s), core units and electrode units, can be electrically interconnected to each other by the corresponding electric power transmitting means T in series and/or parallel circuits based on a single electric power supply sources V1.

Following the basic characteristic of the bell-jar type reactor, a cross-sectional size of the deposition output D, that is, $d1(t)$ and $d2(t)$, increases with the reaction time, t, of the deposition process, and differences in temperature and physical shape between the silicon deposition outputs can be observed according to an installation arrangement of the core units. Thus, in constructing and operating the electrical power supply system for the deposition reactor, it is worthwhile to consider that there may exists differences in the electrical properties between the core units and the core groups, and that the electrical properties can change with time.

If the deposition reactor is to be newly designed to carry out the present invention more effectively, it is necessary to reduce temperature difference and temperature distribution which can be generated between the deposition sections D according to the core group(s) and/or the core units in the process of silicon deposition. To satisfy this requirement, the core group(s) and the core units comprised in the core means C should be appropriately arranged considering the specification or the characteristics of the elements constituting of the deposition reactor such as: the shell Rs, the base unit Rb; the gas supply means Gf; the gas outlet means No; a temperature measuring and controlling system, etc. Also, a spatial change with time due to the growing of the deposition output D, a time-dependent pattern of gas flow within the inner space Ri, a cooling by the heat transfer through the reactor shell Rs, and the like can influence the arrangement (spatial layout) of the core units.

In order to supply a controlled electric power duly to each core group or core unit, it is important to make use of a change of voltage-current characteristics in the electric circuit that should be controlled. However, since it is also important to utilize a detected temperature for controlling the electric power supply system, there is a need to design the deposition reactor so that one or a plurality of non-contact type temperature measuring means, which is commercially available, such as the pyrometer, a temperature-distribution measurement device and the like can be employed by installing at proper locations of the shell Rs and/or the base unit Rb.

Meanwhile, the control parameters and procedure for supplying electric power are normally predetermined to minimize the temperature difference between core units due to the installation arrangement within an allowable temperature range during the operation of the deposition reactor. According to such power supply method, well-controlled electricity can be supplied independently to each core group or core unit.

The electric power supply source V for supplying electric powers to the corresponding core means C through the corresponding electric power transmitting means T can be constructed as a separate, independent electric power supply system for each core group. On the contrary, a plurality of the electric power supply sources may possibly be integrated as a combined, single apparatus, from which electric power is supplied independently to each core group through the corresponding electric power transmitting means T. In the present invention, "an independent electric power supply" means that a current or voltage can be adjusted and applied independently for each of the core groups or core units, irrespective of the configuration of the electric power supply sources.

Unlike the conventional silicon rod preparing method using the core means consisting of the silicon core rods or metallic core elements, the present invention is based on the core means C consisting of the metallic core elements Ca each of which comprises the separation layer Cb formed on the surface thereof as illustrated in FIG. 5 to FIG. 9. Thus, the deposition output D is formed in an outward direction on the electrically heated core means C the surface of which is covered by the separation layer, and thereby a high-purity polysilicon rod can be manufactured. Here, the core means C provided in the inner space Ri of the shell Rs of the deposition reactor is installed so that both ends of the metallic core element Ca constituting a major framework of the core means C can be connected electrically or physically to the corresponding electrode units E. An electrical heating performed thereby maintains the deposition reaction temperature on the surface of the deposition output D. In the present invention, the separation layer Cb formed on the surface of the metallic core element Ca serves as a substrate on which formation of the deposition output D is initiated, and also behaves like a major framework supporting stably the deposition output D enlarged according to the silicon deposition process.

In addition, in the process of silicon deposition on the surface of the deposition output D at a reaction pressure in the range of 1-20 bar absolute and a reaction temperature in the range of 650-1,300° C., the separation layer Cb constituting the surface of the metallic core element Ca acts as a barrier which prevents a diffusion of the impurity components from the corresponding metallic core element Ca to the deposition output D.

Also, the separation layer Cb and the deposition output D can be easily separated from each other because the kind of material, structure and physical properties of the separation layer Cb differ from those of the polysilicon of the deposition output D.

Formed on the surface of the metallic core element Ca and constituting the core means C, the separation layer Cb according to the present invention may consist of one or a plurality of layer(s). If the number of the layers constituting the separation layer Cb exceeds 5, there may be required a lot of time, labor and cost in the separation layer forming process, deteriorating the economical advantage of the present invention. Accordingly, the number of the separation layer(s) is preferably in the range of 1 to 5, i.e., it is recommended that the separation layer Cb consists of five kinds of layers or less.

The separation layer Cb, according to the present invention, includes a function of a diffusion barrier for preventing the diffusion of a specific component or element between two metallic contact areas. Here, the barrier component constituting each layer of the separation layer(s) Cb can be selected from (i) silicon nitride, silicon oxide, silicon carbide or silicon oxynitride or (ii) a nitride, an oxide, a silicide, a carbide, an oxynitride or an oxysilicide comprising at least one metal element constituting the metallic core element and selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), and a mixture thereof.

A barrier component constituting the separation layer Cb, according to the present invention, comprises a substance consisting of a nitride of silicon or an element selected from metals constituting the metallic core element Ca, such a nitride can comprise a single component nitride such as Si—N, W—N, Os—N, Ta—N, Mo—N, Nb—N, Ir—N, Ru—N, Tc—N, Hf—N, Rh—N, V—N, Cr—N, Zr—N, Pt—N, Th—N, Ti—N, Lu—N, Y—N and the like and a mixed metal nitride such as W—V—N, Ti—Si—N, Ti—C—N, Hf—Ta—Mo—N and the like.

Most of such nitride-based components have a melting point of 2,000° C. or higher, where other physical properties of such nitride-based components differ from those of the metallic core element Ca or the deposition output D. Such nitride-based components can combine with metal impurity ions of the metallic core element Ca, which enables such nitride-based components to be used for forming the separation layer Cb. However, there is little possibility of contaminating the deposition output D with nitrogen component of the nitride-based separation layer Cb at a high reaction temperature, and so the nitride-based separation layer can be used for forming one or a plurality of separation layer(s) Cb and can constitute the metallic core means C, together with the oxide-based, oxynitride-based, carbide-based, silicide-based or oxysilicide-based separation layer Cb.

A barrier component constituting the separation layer Cb according to the present invention comprises a substance consisting of an oxynitride of silicon or an element selected from metals constituting the metallic core element Ca, where such an oxynitride can comprise a single component oxynitride such as Si—O—N, W—O—N, Os—O—N, Ta—O—N, Mo—O—N, Nb—O—N, Ir—O—N, Ru—O—N, Tc—O—N, Hf—O—N, Rh—O–N, V—O—N, Cr—O—N, Zr—O—N, Pt—O—N, Th—O—N, Ti—O—N, Lu—O—N, Y—O—N and the like, and a mixed metal oxynitride such as Si—Al—O—N, Hf—Zr—O—N, Mo—W—O—N, V—Mo—W—O—N and the like.

Most of such oxynitride-based components have a melting point of 2,000° C. or higher, where other physical properties of the oxynitride-based components differ from those of the metallic core element Ca or the deposition output D, and the oxynitride-based components can combine with metal impurity ions of the metallic core element Ca, which enables the oxynitride-based components to be used for forming the separation layer Cb. However, there is little possibility of contaminating the deposition output D with nitrogen component of the oxynitride-based separation layer Cb, at a high reaction temperature, and so the oxynitride-based separation layer can be used for forming one or a plurality of separation layer(s) Cb and can constitute the core means C together with the nitride-based, oxide-based, carbide-based, silicide-based or oxysilicide-based separation layer Cb.

A barrier component constituting the separation layer Cb according to the present invention comprises a substance consisting of an oxide of silicon or an element selected from metals constituting the metallic core element Ca, where such an oxide can comprise a single component oxide such as Si—O, W—O, Ta—O, Nb—O, Hf—O, Zr—O, Ti—O and the like, and a mixed metal oxide such as W—V—O, Ti—Si—O, Sr—Ti—O, Sr—Ti—Nb—O, Sr—La—Al—O, La—Mn—O, Sr—Hf—O, Nb—Ta—O, Ba—Zr—O, Ba—Mo—O, B—Ce—O, Ba—Ti—O, Ca—Ti—O, Sr—Zr—O, Sr—Mn—O, Hf—Ta—Mo—O, Y—Zr—O and the like.

Most of such oxide-based components have a melting point of 1,420° C. or higher, where other physical properties of the oxide-based components differ from those of the metallic core element Ca or the deposition output D which enables the oxide-based components to be combined with metal impurity ions of the metallic core element Ca, and so the oxide-based components can be used for forming the separation layer Cb. However, there is little possibility of contaminating the deposition output D with oxygen component of the oxide-based separation layer Cb at a high reaction temperature, and so the oxide-based separation layer can be used for forming one or a plurality of separation layer(s) Cb and can constitute the core means C together with the nitride-based, oxynitride-based, carbide-based, silicide-based or oxysilicide-based separation layer Cb.

A barrier component constituting the separation layer Cb, according to the present invention, comprises a substance consisting of a carbide of silicon or an element selected from metals constituting the metallic core element Ca, where such a carbide can comprise a single component carbide such as Si—C, W—C, Os—C, Ta—C, Mo—C, Nb—C, Ir—C, Ru—C, Tc—C, Hf—C, Rh—C, V—C, Cr—C, Zr—C, Pt—C, Th—C, Ti—C, Lu—C, Y—C and the like, a mixed metal carbide such as Si—W—C, Ta—Hf—C, Si—Ti—C and the like, and the transition metal carbon nitride such as W—C—N, Ta—C—N, Zr—C—N, Ti—C—N and the like.

Most of such carbide-based components have a melting point of 2,000° C. or higher, where other physical properties of the carbide-based components differ from those of the metallic core element Ca or the deposition output D, and the carbide-based components can combine with metal impurity ions of the metallic core element Ca, which enables the carbide-based components to be used for forming the separation layer Cb. However, there is a possibility of contaminating the deposition output D with a carbon component of the carbide-based separation layer Cb at a high reaction temperature, and so it is also desirable to isolate the deposition output D with the nitride-based oxynitride-based, silicide-based, or oxysilicide-based separation layer Cb, rather than applying in the form of a single separation layer Cb.

A barrier component constituting the separation layer Cb, according to the present invention, comprises a substance consisting of a silicide of silicon or an element selected from metals constituting the metallic core element Ca, where such a silicide can comprise a single component silicide such as W—Si, Os—Si, Ta—Si, Mo—Si, Nb—Si, Ir—Si, Ru—Si, Tc—Si, Hf—Si, Rh—Si, V—Si, Cr—Si, Zr—Si, Pt—Si, Th—Si, Ti—Si, Lu—Si, Y—Si and the like, mixed metal silicide such as W—V—Si, W—Ti—Si—N, Ti—Zr—Si—C, Hf—Ta—Si—N and the like, and such silicide based component can comprises oxysilicide obtained by adding oxygen element to a silicide mentioned above.

Content of components can be adjusted so that such silicide-based or oxysilicide-based components can have a melting point of 1,420° C. or higher, the physical properties of such silicide-based or oxysilicide-based components differ from those of the metallic core element Ca or the deposition output D and that the silicide-based or oxysilicide-based components can combine with metal impurity ions of the metallic core element Ca, and so the silicide-based or oxysilicide-based components can be used for forming one or a plurality of the separation layers Cb. The silicide-based or oxysilicide-based separation layer can form the core means C together with the nitride-based, oxide-based, oxynitride-based, or carbide-based separation layer Cb.

As described above, a barrier component constituting the separation layer Cb may comprise a boron-containing component having an excellent physical property such as a nitride, an oxide, a carbide or an oxynitride. Since there is a possibility of contaminating the deposition output D with a boron component in the boron-based separation layer Cb at high reaction temperature, the metallic core element Ca should be isolated perfectly from the deposition output D with the nitride-based oxynitride-based, silicide-based, or oxysilicide-based separation layer Cb rather than applying it in the form of a single separation layer Cb.

According to the present invention, constitution of the core means C by forming the separation layer Cb on the surface of the core element Ca can be performed in a variety of methods.

As an example of the separation layer forming process, the core means C can be constituted by surrounding the surface of the core element Ca with one or a plurality of separation layer constituting unit(s) made of a barrier component as described above. When such separation layer constituting unit(s) is(are) to be assembled into the separation layer Cb, each unit needs to be prepared or coated in advance with the barrier component at a predetermined dimension, shape and number. Then, the core means C can be completed by assembling them in layer(s) or by connecting them each other or by forming further the thus prepared separation layer constituting units in such a manner that the core element Ca can be encompassed by the separation layer(s) Cb. This method is especially suitable for a case when an assembled type core unit is constructed by assembling a plurality of core element units. Consisting of one or a plurality of separation layer(s) Cb composed of the barrier component in a thickness direction, each of the separation layer constituting units may be independently prepared in advance with a cross-sectional shape of a circle, a polygon, a concentric circle or a concentric polygon. The core unit can now be constructed by assembling in layers, connecting in a concentric way the core element Ca together with thus prepared separation layer constituting units. According to this method, a tiny space may exist between the surface of the core element Ca and the separation layer, between the separation layers or between the separation layer constituting units. However, if any, the existence of the tiny space does not exert an adverse effect on the formation of the deposition output in an outward direction on the core element pursuant to the present invention.

Unlike the above, the separation layer Cb is formed by coating the barrier component on the surface of the core element Ca. The direct coating of each of the selected barrier components may be applied on its surface in a predetermined thickness. If this direct coating method is employed, the separation layer Cb consisting of a plurality of layers may be formed in sequence even within the same coating apparatus or may be formed in a number of separate coating apparatus. According to this method, the separation layer required can be formed so dense and intimate that a tiny space between the surface of the core element Ca and the separation layer or between the separation layers can hardly be observed, without causing any problems in the formation of the deposition output D.

On the other hand, each of the core units C, consisting of the core element and the separation layer formed thereon, may also be prepared by employing both the scheme of assembling the separation layer constituting units with the core element and the scheme of the direct coating of the separation layer.

Part of or the entire separation layer(s) Cb may be formed on the surface of the core element Ca in another kind of reactor or a special coating apparatus according to the present invention. Otherwise, the same work can also be executed in a silicon deposition reactor; the work may also be carried out in the inner space Ri of the deposition reactor used in the present invention or of an existing conventional deposition reactor available. Here, one or a plurality of the core elements Ca are installed on the corresponding electrode units of the deposition reactor; the core elements become heated upon supplying electricity through the electrode units; then a raw material gas is supplied into the inner space of the deposition reactor to form the separation layer Cb on the surface of the core element Ca; and a completed set of the core means C is finally obtained.

Meanwhile, the separation layer forming process can also be executed by a combined use of the deposition reactor and the other kind of coating apparatus in sequence; for example, after forming part of the separation layer in a special coating apparatus, it is possible to additionally form the remaining part of the separation layer Cb in the deposition reactor pursuant to the present invention or in the existing conventional deposition reactor. In either of the deposition reactors, one or a plurality of the uncompleted core elements Ca is(are) installed on the corresponding electrode units, and will be heated upon supplying electricity through the electrode units; then a raw material gas is supplied into the inner space of the deposition reactor to additionally form the remaining part of the separation layer Cb on the surface of the uncompleted core elements Ca; and a completed set of the core units represented by the core mean C is finally obtained.

In the process of forming the separation layer Cb consisting of a single layer or a plurality of layers according to the present invention, a method for forming the separation layer(s) can be selected from a number of well-established coating methods such as: (i) physical vapor deposition method (including sputtering deposition method, pulsed laser deposition method, ion injection method and ion plating method, etc.); (ii) chemical vapor deposition method (including normal pressure chemical vapor deposition method, metallic organic chemical vapor deposition method, plasma-enhanced chemical vapor deposition method, etc.); (iii) melt spray coating method (including various kinds of spray methods and aerosol deposition method); (iv) thermo-reactive deposition and diffusion method (including molten salt method and powder method); and (v) sol-gel method and solution method.

The thickness of the individual separation layer Cb formed on the surface of the core element Ca for constituting the core means C according of the present invention depends on such factors as the type or material of the of the core element Ca, the characteristic of impurity components, the barrier component constituting the separation layer and the method for forming the separation layer, etc. The thickness of the individual separation layer may be in the range of several nanometers (nm) to several millimeters (mm).

In general, the thicker separation layer is believed to more faithfully prevent the diffusion of impurity components from the core element Ca to the deposition output D. However, the separation layer Cb thicker than about 20 mm would impose an excessive cost burden and an unnecessarily large temperature gradient along the separation layer Cb, which makes it very difficult to maintain the temperature of the surface of the deposition output D as required. Meanwhile, it is also possible to employ here an advanced technology which has recently been developed and used for forming an atomic layer or thin film with a thickness of several nanometers (nm). Such a thin layer with a thickness of 10 nm or less formed by the sophisticated method may also prevent the diffusion of the impurity components. However, considering the dimension of a structural defect often detected on the surface of the core element Ca and the separation layer Cb and an actual roughness dimension of the interface between the core element and the separation layer, the thickness of the separation layer Cb should be greater than 10 nm. Accordingly, the overall thickness of the separating layer(s) Cb formed on the core element Ca of the core means C should preferably be in the range of 10 nm-20 mm in the present invention.

The separation layer(s) Cb may have either an electric conductivity or insulation property. This requires a careful consideration of an electrical characteristic of the outermost separation layer Cb of the core means C when it is connected and fixed to the corresponding, highly conductive electrode units. When the separation layer Cb has an excellent electric conductivity, the core element Ca is in good contact with the electrode units through the separation layer Cb. However, in a case where the separation layer Cb contains a barrier component with an electric insulation property, such a separation layer should not be formed at both ends of the core unit so that the conductive electrode units can contact directly with the resistive core element instead of the separation layer that causes a serious contact resistance.

During migration from the core element Ca to the deposition output D, the impurity components can react well or combine with silicon atom. Thus, it does not matter if the separation layer Cb further comprises a silicon separation layer containing silicon as a barrier component to constitute the core means C. To prevent the deposition output D from being contaminated by the impurity components the silicon separation layer can be placed between the core element Ca and the separation layer Cb, between the separation layers Cb or at the outmost of the separation layer Cb. If the silicon separation layer is further added, the thickness of the silicon layer to be in the range of 1 µm-10 mm. If its thickness is less than 1 µm, the barrier which can prevent an impurity contamination becomes insufficient. However, when the thickness is greater than 10 mm, the barrier becomes unnecessarily large and requires serious sacrifices in various aspects such as the cost and productivity of the reactor. Regarding the silicon separation layer Cb containing silicon as the barrier component, it does not matter if the separation layer Cb comprises the silicon separation layer Cb which is formed by using the reaction gas Gf as the raw material gas. Here, the formation of the silicon separation layer Cb needs to be optimized in terms of crystal structure and the characteristic of thermal expansion so that the silicon deposition output D can be easily separated from the silicon separation layer.

Accordingly, part of the separation layer(s) or the entire separation layer(s) Cb of the barrier component and/or silicon can be formed on the surface of the core element Ca in a deposition reactor according to the present invention, or in an existing conventional deposition reactor constructed by the prior art. The same work can also be executed by using a special coating apparatus, a thin layer forming apparatus or another kind of reactor.

As described above, instead of being performed in a separate apparatus, the work for adding the silicon separation layer containing silicon as a barrier component and constituting the core means C can be executed in the inner space Ri of the deposition reactor used in the present invention. Also, the silicon separation layer may be formed on the core means C employing the reaction gas Gf according to the present invention as a raw material gas for the separation layer. Here, the formation of the silicon separation layer Cb needs to be optimized in terms of crystal structure and the characteristic of thermal expansion so that the deposition output D can be easily separated from the silicon separation layer.

Meanwhile, it is preferable to perform an heat treatment at a temperature in the range of 400-3,000° C. to remove or to chemically convert the residual impurity components during the process of preparing the core unit used in the present invention, before/after machining the core element Ca, or before/after or during the formation of the separation layer or before the operation of silicon deposition. And, the heat treatment of the core unit or the core element may be performed under the gaseous atmosphere such as hydrogen, nitrogen, argon or helium and the like. The heat treatment can be performed in the deposition reactor used in the present invention, the existing conventional deposition reactor constructed by the prior art, or in a special heat treatment or coating apparatus.

As described above, after the core means is electrically, rapidly and easily heated from room temperature to the reaction temperature according to the present invention, the silicon deposition output is formed in an outward direction on the core means through the supply of the reaction gas. This process of silicon deposition is substantially the same as that in the conventional deposition reactor.

Accordingly, if an electrical heating can be performed by use of the electrode units, it is possible to apply the present invention without any difficulty in all kinds of deposition reactors available, which are manufactured and installed according to the methods in the prior art, by employing the metallic core means by the present invention on behalf of the conventional core means made of silicon material.

Once the diameter or diagonal length of the silicon rod reaches a maximum allowable value, the operation of silicon deposition is fulfilled according to the present invention. Then the deposition operation is halted before an unwanted contact between two adjacent deposition outputs D occurs. Thereafter, the reactor is dismantled and the deposition output is collected as product.

In order to use the polysilicon outputs manufactured according to the present invention as the raw material for preparing polycrystalline or single crystalline ingot, block, sheet or film, it is necessary to divide the silicon rod output into the deposition output D and the core element and/or the separation layer Cb.

Following the present invention, the core element Ca, the separation layer Cb and the deposition output D are different from each other from the aspect of a composition, a crystal structure or a physical characteristic. Therefore, it is not so difficult to separate and collect the deposition output D from the rod-shaped polysilicon obtained by the present invention. In such separation process, the core element Ca or the separation layer Cb can be subject to a damage or breakage. However, if the separation layer forming process is carried out in an optimum condition, it is possible to recover the core element Ca and/or the separation layer Cb as it is and to recycle them for a repeated use.

The high-purity polysilicon output manufactured according to the present invention is employed as a raw material for semiconductor devices, solar cells, chemical processing units, industrial systems, or small-sized and highly integrated precision devices, which are respectively composed of a material with high purity or semiconducting properties.

The polysilicon output prepared by the present invention can be processed into a cylindrical or hexahedral shape in accordance with the required size and then packaged. Also, the polysilicon output can be pulverized further into chunks, nuggets, chips or particle shaped silicon products. If necessary, the product is cleaned further and dried to remove the impurity components out of the surface thereof contaminated during the pulverizing process.

The product processed into a cylindrical shape can be used for single crystal growth according to the floating zone method. The pulverized product having irregular shapes and various sizes may be melted in a crucible and then formed into a single crystalline or polycrystalline ingot, block, sheet or film shaped article.

The present invention is described in more detail below taken in conjunction with the following embodiments. However, they should not be construed as limiting the scope of the present invention.

FIG. 3 illustrates a planar arrangement of the core means C consisting of 36 sets of core units having the same shape, where each of the core units has a circular cross-section with the separation layer Cb being formed on the surface of the metallic core element Ca according to the present invention. In such a deposition reactor, the electric power supply system can be constituted so that all the core units can be disposed in series and/or parallel circuits. However, since the voltage for the electricity supplied from the electric power supply source V may be imposed too low or too high according to the circuit configuration, the core means C in this embodiment are divided into 6 kinds of core groups, core group-A to core group-F, according to the installation arrangement, i.e., spatial layout of the core means C. Here, each of the core groups comprises 6 sets of core units. The electrodes E of this embodiment are connected to one electric power supply source or a plurality of electric power supply sources through the electric power transmitting means T based on the electric circuit configured so that the core groups can be interconnected to each other in parallel, while the core units comprised in each core group can be interconnected to each other in series. In such an electric power supply system, the electric current flows along the path of $A1 \rightarrow A2 \rightarrow A3 \rightarrow A4 \rightarrow A5 \rightarrow A6$ in case of the core group-A, and it is preferred to provide an electric power transmitting means T' or an electrical connecting means through which the adjacent electrode units E can be electrically connected to each other according to the circuit configuration constructed. Once the reaction gas Gf is supplied into the inner space Ri of the deposition reactor with the core means C being electrically heated based on such installation arrangement of the core means and the electric power supply system constructed according to the arrangement, the silicon deposition output D is formed and enlarged in an outward direction on the core means C. During this deposition process the deposition output D cannot be apparently contaminated by the impurity components migrating from the metallic core element Ca. Consequently, a rod-shaped polysilicon having a near circle cross-section is manufactured.

FIG. 4 illustrates a planar arrangement of the core means C consisting of 12 sets of core units. Here, employing two kinds of cross-sections according to the present invention, the core units individually comprises the separation layer Cb formed on the surface of the metallic core element Ca. In such a deposition reactor, the electric power supply system can be constituted so that all the core units can be disposed in series and/or parallel circuits. However, since the voltage for the electricity supplied from the electric power supply source V may be imposed too low or too high according to the circuit configuration, the core means C in this embodiment are divided into the core group-A consisting of 8 sets of core units and the core group-B consisting of 4 sets of core units. Here, each core unit of the core group-A is composed of the ribbon- or strip-shaped metallic core element, while that of the core group-B is composed of the hollow, concentric tube- or conduit-shaped metallic core element. The electrodes E of this embodiment are connected to one electric power supply source or a plurality of electric power supply sources through the electric power transmitting means T based on the electric circuit configured so that the core groups be interconnected to each other in parallel, with the core units comprised in each core group being interconnected to each other in series. In such an electric power supply system, the electric current flows along the path of $B1 \rightarrow B2 \rightarrow B3 \rightarrow B4$ in case of the core group-B, and it is preferred to provide an electric power transmitting means T' or an electrical connecting means through which the adjacent electrode units E can be electrically connected to each other according to the circuit configuration constructed. Once the reaction gas Gf is supplied into the inner space Ri of the deposition reactor with the core means C being electrically heated based on such installation arrangement of the core means and the electric power supply system constructed according to the arrangement, the silicon deposition output D is formed and enlarged in an outward direction on the core means C. During this deposition process the deposition output D cannot be apparently contaminated by the impurity components migrating from the metallic core element Ca. Consequently, a rod-shaped polysilicon having a near circle cross-section is manufactured.

In order to manufacture high-purity polysilicon which can be used as a raw material for the semiconductor devices and/or the solar cells according to the present invention, it is indispensable to form the separation layer Cb on the surface of the metallic core element Ca.

As illustrated in FIG. 8, for example, if the separation layer Cb consisting of a Ti—N layer with a thickness of about 30 µm [=(db−da)/2], a silicon layer with a thickness of about 50 µm and a Si—N layer with a thickness of about 10 µm is formed on the surface of the rod-shaped core element Ca made of tungsten with purity of 99%, it is possible to prevent a contamination of the deposition output D by the impurity components of the core element Ca such as tungsten. Such beneficial effect of the separation layer can be verified easily by an analysis using the Inductively Coupled Plasma Mass Spectrometry (ICP-MS) and the like.

As another example, as illustrated in FIG. 6, two kinds of separation layers of a Ti—N layer Cb with a thickness of about 30 μm [=(db−da)/2] and a W—Si layer Cb' with a thickness of about 800 μm are formed on the surface of the rod-shaped core element Ca made of tungsten with purity of 99.9%, and thus it is possible to prevent a contamination of the deposition output D by the impurity components of the core element Ca such as tungsten.

When the silicon layer is added as described above to the separation layer Cb, the reaction gas used in the present invention for the deposition process can be supplied as the feed gas to form the silicon separation layer for preparing the core means C.

The process for forming the silicon separation layer or various kinds of separation layer on the surface of the metallic core element Ca can be executed in a special coating apparatus or reaction apparatus. Otherwise, this process may be executed in a state that the metallic core elements Ca and the electrode units E are connected to each other and installed in the inner space of the bell-jar type deposition reactor applicable to the present invention, the metallic core elements Ca are heated by supplying electricity through the electrode units E, and a feed gas for forming the silicon layer or the other separation layer is supplied into the inner space, and thereby the core means C required in the present invention can be prepared.

Meanwhile, it is also possible to prepare the core means C required in the present invention by a method wherein a preliminary core means, prepared in advance by forming part of the separation layer(s) Cb' on the metallic core element, and the electrode means E are connected to each other and installed in the inner space of the deposition reactor, the preliminary core means is heated by supplying electricity through the electrode means E, a feed gas for forming an additional separation layer(s) Cb" is/are supplied into the inner space, and thus the additional separation layer(s) Cb" comprising silicon or other barrier components is/are formed on the surface of the preliminary core means.

The beneficial effects by the separation layer Cb can be achieved by applying the core element Ca made of an alloy other than the high-purity transition metal. For example, when an alloy, in which elements of thorium (Th), lanthanum (La), and/or titanium (Ti), etc., are incorporated in tungsten (W) in the range of 0.2-3 wt %, is used as the metallic core element Ca, the effect of the separation layer Cb can be also obtained.

According to the present invention, various modes of the separation layer formation are applicable in preventing the contamination of the deposition output D attributed to the components of the core element Ca which can have various shapes such as: a rod, a wire or a filament with a circular cross-section as illustrated in FIG. 5, FIG. 6 and FIG. 8; a conduit, tube or a duct having a cross-section of a concentric rectangle as illustrated in FIG. 7; and a strip or a ribbon having a rectangular cross-section as illustrated in FIG. 9.

In preparing the core means C impurity components can also be incorporated into or be generated within the core means C in the process of forming the separation layer Cb or of machining the core unit into a shape required for a tight installation on the corresponding electrode units. Thus, for applying the metallic core means C according to the present invention, It is preferred that the core units constituting the core means C heat-treated at a temperature in the range of 400-3,000° C. The heat treatment to remove or chemically convert residual impurity components can be executed under vacuum or under an atmosphere of high-purity hydrogen, nitrogen, argon or helium.

As described above, after a rod-shaped polysilicon is obtained in the deposition reactor by means of the core means C prepared according to the present invention, it becomes necessary to separate the silicon deposition output D to be used as the product from the metallic core element Ca or the separation layer Cb or the core means C. According to the present invention, the above separation process can be carried out easily. The core means C damaged in the above separation process may be discarded. Further, the metallic core element Ca, the separation layer Cb or the core means C, which is not damaged but separated and recovered, may be used repeatedly to form the silicon deposition output D after an appropriate cleaning process, if necessary.

INDUSTRIAL APPLICABILITY

As described above, the method for preparing the polysilicon rod according to the present invention has the following advantages.

1) Preparation of the core means made of a high purity-silicon material requires a relatively high expense for the low-productive process in forming and machining the core means, thus increasing the economic burden. On the contrary, the present invention offers an economical and efficient preparation of the core means based on cheaper core material, less expense in forming and machining the core means and increased productivity.

2) The separation layer formed on the surface of the metallic core element according to the present invention can prevent or deter the diffusion of the impurity components from the metallic core element to the deposition output during the high-temperature process of silicon deposition, thus capable of using the metallic core element for preparing the high-purity polysilicon rod.

3) Contrary to the inevitable step of preheating the conventional silicon-based core means based on an complicated operation of an expensive electric power supply equipment, the core means according to the present invention can be easily heated electrically from room temperature to a reaction temperature based a simple operation of a common and inexpensive electric power supply equipment. Therefore, the present invention has an advantage with respect to the cost of the equipment and the core means, the rate of electrical heating, the operation cycle of the deposition reactor for the same production yield, and the productivity of the deposition reactor.

4) Since the metallic core element is superior to silicon core material in physical strength, the structural stability of the polysilicon rod obtained by the deposition is enhanced. Thereby, it is possible to manufacture the polysilicon rod having a larger diameter and length, thus remarkably enhancing the production capacity per each deposition reactor.

5) In the present invention, since the metallic core element having a melting point much higher than that of the silicon material can be used for constituting the core means, a maximum allowable temperature of the metallic core element is higher than the melting point of silicon so that it is possible to increase the maximum diameter of the silicon rod and maintain the temperature of surface of the silicon rod relatively high when the core means is heated. As a result, the productivity and economical efficiency of the silicon deposition reactor can be enhanced significantly.

6) The metallic core means according to the present invention is characterized in that the product contamination can be minimized or prevented in spite of the metallic core element. Thus, the present invention can be widely applied to all kinds of deposition reactors for preparing a rod-shaped polysilicon irrespective of a shape or a structure of the deposition reactor including the bell-jar type, tube type or chamber type deposition reactor. The present invention can be applied even to a conventional deposition reactor manufactured and constructed by the prior art, enhancing the reactor productivity.

While the present invention has been described and illustrated herein with reference to the preferred embodiment thereof, it will be apparent to those skilled in the art that various modifications and variations can be made therein without departing from the spirit and scope of the invention. Therefore, it is intended that the present invention covers the modifications and variations of this invention that come within the scope of the appended claims and their equivalents.

The invention claimed is:

1. A method for preparing a polysilicon rod using a metallic core means, comprising:
    maintaining the metallic core means being installed in an inner space of a deposition reactor used for preparing the polysilicon rod;
    forming one or a plurality of separation layer(s) on a surface of a metallic core element constituting the metallic core means
    heating the metallic core means by supplying electricity through an electrode means; and
    supplying a reaction gas into the inner space for silicon deposition, thereby forming a deposition output in an outward direction on the surface of the metallic core means.

2. The method for preparing the polysilicon rod using the metallic core means according to claim 1, wherein the reaction gas contains at least one silicon-containing component selected from the group consisting of monosilane ($SiH_4$), dichlorosilane ($SiH_2Cl_2$), trichlorosilane ($SiHCl_3$), silicon tetrachloride ($SiCl_4$) and a mixture thereof.

3. The method for preparing the polysilicon rod using the metallic core means according to claim 2, wherein the reaction gas further contains at least one gas component selected from the group consisting of hydrogen, nitrogen, argon, helium, hydrogen chloride, and a mixture thereof.

4. The method for preparing the polysilicon rod using the metallic core means according to claim 1, wherein the silicon deposition occurs in the inner space at a reaction pressure in the range of 1-20 bar absolute and a reaction temperature in the range of 650-1,300° C. based on the surface temperature of the deposition output.

5. The method for preparing the polysilicon rod using the metallic core means according to claim 1, wherein the metallic core element has a shape selected from the group consisting of a rod, a wire, a filament, a bar, a strip and a ribbon having a cross-sectional shape of a circle, an oval or a polygon, and of a conduit, a tube, a cylinder, and a duct having a cross-sectional shape of a concentric circle, a concentric oval or a concentric polygon.

6. The method for preparing the polysilicon rod using the metallic core means according to claim 1, wherein the metallic core element is a metal or an alloy comprising at least one metal element selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), ferrum (Fe), nickel (Ni), aluminum (Al) and a mixture thereof.

7. The method for preparing the polysilicon rod using the metallic core means according to claim 1, wherein the number of the separation layer(s) is in the range of 1 to 5.

8. The method for preparing the polysilicon rod using the metallic core means according to claim 7, wherein the separation layer(s) is selected from the group consisting of silicon nitride, silicon oxide, silicon carbide, silicon oxynitride and a mixture thereof.

9. The method for preparing the polysilicon rod using the metallic core means according to claim 7, wherein the separation layer(s) is selected from a nitride, an oxide, a silicide, a carbide, an oxynitride or an oxysilicide comprising at least one metal element selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), and a mixture thereof.

10. The method for preparing the polysilicon rod using the metallic core means according to claim 7, wherein the overall thickness of the separation layer(s) is in the range of 10 nm to 20 mm.

11. The method for preparing the polysilicon rod using the metallic core means according to claim 1, further comprising forming a silicon layer on the separation layer(s), wherein the silicon layer has a thickness in the range of 1 μm-10 mm.

12. The method for preparing the polysilicon rod using the metallic core means according to claim 11, wherein the silicon layer is formed by supplying a feed gas into the inner space of the deposition reactor and by supplying an electricity through the metallic core element, the metallic core element is connected to an electrode means.

13. The method for preparing the polysilicon rod using the metallic core means according to claim 1, wherein one or the plurality of separation layer(s) is/are formed in an apparatus other than the deposition reactor.

14. The method for preparing the polysilicon rod using the metallic core means according to claim 1, wherein one or the plurality of separation layer(s) is/are formed in the deposition reactor.

15. The method for preparing the polysilicon rod using the metallic core means according to claim 1, further comprising forming a preliminary core means, prepared in advance by forming part of the separation layer(s) on the metallic core element in the deposition reactor and/or an apparatus other than the deposition reactor.

16. The method for preparing the polysilicon rod using the metallic core means according to claim 1, wherein the core means is prepared by assembling a separation layer prepared in advance together with the metallic core element in such a manner that the separation layer encompasses the metallic core element.

17. The method for preparing the polysilicon rod using the metallic core means according to claim 12, wherein the silicon layer and the deposition output are different from each other in terms of crystal structure and thermal expansion.

18. The method for preparing the polysilicon rod using the metallic core means according to claim 1, wherein the metallic core element is treated by a heat in the range of 400-3,000° C. before or after forming the one or the plurality of separation layer(s).

19. The method for preparing polysilicon rod using the metallic core means according to claim 18, wherein the metallic core element is treated by the heat under a predetermined gaseous atmosphere.

20. A method for preparing a polysilicon rod using a metallic core means, comprising:
- maintaining a metallic core element constituting the metallic core means being installed in an inner space of a deposition reactor used for preparing the polysilicon rod;
- heating the metallic core element by supplying electricity through an electrode means;
- preparing the metallic core means by forming one or a plurality of separation layer(s) on a surface of the metallic core element;
- heating the metallic core means by supplying electricity through an electrode means; and
- supplying a reaction gas into the inner space for silicon deposition, thereby forming a deposition output in an outward direction on the surface of the metallic core means.

* * * * *